United States Patent
Maejima

(10) Patent No.: US 8,724,370 B2
(45) Date of Patent: *May 13, 2014

(54) SEMICONDUCTOR STORAGE DEVICE

(75) Inventor: Hiroshi Maejima, Chuo-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 114 days.

This patent is subject to a terminal disclaimer.

(21) Appl. No.: 13/414,324

(22) Filed: Mar. 7, 2012

(65) Prior Publication Data

US 2012/0163066 A1    Jun. 28, 2012

Related U.S. Application Data

(63) Continuation of application No. 12/720,121, filed on Mar. 9, 2010, now Pat. No. 8,159,859.

(30) Foreign Application Priority Data

Mar. 16, 2009 (JP) ................. 2009-063565

(51) Int. Cl.
*G11C 11/00* (2006.01)
(52) U.S. Cl.
USPC ............................. 365/148; 365/163
(58) Field of Classification Search
USPC ......................... 365/148, 163, 189.16
See application file for complete search history.

(56) References Cited

U.S. PATENT DOCUMENTS

| | | | |
|---|---|---|---|
| 7,423,898 B2 * | 9/2008 | Tanizaki et al. | 365/148 |
| 7,606,086 B2 | 10/2009 | Inoue | |
| 8,031,508 B2 | 10/2011 | Toda et al. | |
| 2009/0046496 A1 | 2/2009 | Katoh | |
| 2010/0080040 A1 | 4/2010 | Choi | |

* cited by examiner

*Primary Examiner* — Vu Le
(74) *Attorney, Agent, or Firm* — Oblon, Spivak, McClelland, Maier & Neustadt, L.L.P.

(57) ABSTRACT

A semiconductor storage device includes: a memory cell array including memory cells, each of the memory cells having a variable resistance element; and a control circuit configured to apply a control voltage, which is necessary for the variable resistance element to transit a resistance state, to a selected memory cell. When applying the control voltage plural times, the control circuit operates to set a value of the control voltage applied in a first control voltage application operation to be substantially equal to a minimum value of distribution of the voltage values of all the memory cells in the memory cell array required to transit the resistance state of the variable resistance element from a high resistance state to a low resistance state. The control circuit operates to perform a plurality of control voltage application operations by increasing the value of the control voltage by a certain value.

10 Claims, 15 Drawing Sheets

ReRAM, Diode characteristics

|  | Typical | VARIATION |
|---|---|---|
| ReRAM Set Voltage | 1.53V | ±0.75V(3σ) |
| ReRAM Reset Voltage | 0.64V | ±0.33V(3σ) |
| Diode Set Voltage | 0.6V | ±0.1V(3σ) |
| Diode Reset Voltage | 1.0V | ±0.17V(3σ) |
| Vforming | 5~10V |  |
| Iset | 3.75nA |  |
| Ireset | 9.24uA |  |

WIRING RESISTANCE (1.5ohm/WL1K&BL4K)=16kohm

Sense Amp & Write Buffer 22

VCol Driver 23

SEMICONDUCTOR STORAGE DEVICE

CROSS REFERENCE TO RELATED APPLICATIONS

This application is a continuation of U.S. application Ser. No. 12/720,121 filed Mar. 9, 2010, and is based upon and claims the benefit of priority from prior Japanese Patent Application No. 2009-63565, filed on Mar. 16, 2009, the entire contents of each of which are incorporated herein by reference.

BACKGROUND OF THE INVENTION

1. Field of the Invention

The present invention relates to a semiconductor storage device, and in particular, to a semiconductor storage device with a structure where memory cell arrays are laminated on the semiconductor substrate.

2. Description of the Related Art

Resistive memory has attracted increased attention as a likely candidate for replacing flash memory. As described herein, it is assumed that the resistive memory devices include Resistive RAM (ReRAM), in a narrow sense, that uses a transition metal oxide as a recording layer and stores its resistance states in a non-volatile manner, as well as Phase Change RAM (PCRAM) that uses chalcogenide, etc., as a recording layer to utilize the resistance information of crystalline states (conductors) and amorphous states (insulators).

It is known that the variable resistance elements in resistive memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner (see Japanese National Publication No. 2005-522045).

For unipolar-type ReRAM, data is written to a memory cell by applying, for a short period of time, a certain voltage to a variable resistance element. As a result, the variable resistance element changes from a high resistance state to a low resistance state. The operation of changing a variable resistance element from a high resistance state to a low resistance state is hereinafter referred to as the "set operation". On the other hand, data is erased from a memory cell MC by applying, for a long period of time, a certain voltage that is lower than that applied in the set operation to a variable resistance element in its low resistance state after the set operation. As a result, the variable resistance element changes from a low resistance state to a high resistance state. The operation of changing a variable resistance element from a low resistance state to a high resistance state is hereinafter referred to as the "reset operation".

It is necessary to flow a current of several μA to change a selected memory cell from the low resistance state to the high resistance state in the reset operation. Although the current flows to a selected word line and a selected bit line, since a wiring resistance of these wirings is about several tens of KΩ, a voltage drop (IR drop) due to the wiring resistance cannot be ignored. When a voltage drop due to a parasitic resistance of overall paths to which a reset current flows is taken into consideration, it is necessary to apply a voltage, which is larger than a certain voltage necessary for the reset operation of the variable resistor element, to a selected bit line to which the selected memory cell is connected. With this operation, even if the voltage drop due to the parasitic resistance occurs, a desired voltage and the reset current can be supplied to the selected memory cell.

When the selected memory cell is changed from the low resistance state to the high resistance state by the reset operation, a current, which flows to the selected word line and the selected bit line, abruptly decreases in turn. Accordingly, a voltage drop due to the parasitic resistance of the wirings almost disappears in turn. As a result, there is a possibility that a voltage, which exceeds the certain voltage necessary for the reset operation and is as high as a set voltage, is applied to the selected memory cell placed in the high resistance state and a so-called erroneous set operation, in which the memory cell is subjected to the set operation by mistake after the completion of the reset operation, may be generated.

SUMMARY OF THE INVENTION

One aspect of the present invention provides a semiconductor storage device comprising: a memory cell array including a plurality of first wirings, a plurality of second wirings intersecting the first wirings, and memory cells positioned at intersecting portions between the first wirings and the second wirings, each of the memory cells having a series circuit of a non-ohmic element and a variable resistance element; and a control circuit configured to apply a control voltage, which is necessary for the variable resistance element to transit from a low resistance state to a high resistance state, to a selected memory cell through a selected first wiring and a selected second wiring, when applying the control voltage to the memory cell plural times, the control circuit operative to set a value of the control voltage applied in a first control voltage application operation to be substantially equal to a minimum value of distribution of the voltage values of all the memory cells in the memory cell array required to transit the resistance state of the variable resistance element in the memory cell from the high resistance state to the low resistance state, and the control circuit operative to perform a plurality of control voltage application operations by increasing the value of the control voltage by a certain value in each of second and subsequent control voltage application operations.

Another aspect of the present invention provides a semiconductor storage device comprising: a memory cell array including a plurality of first wirings, a plurality of second wirings intersecting the first wirings, and memory cells positioned at intersecting portions between the first wirings and the second wirings, each of the memory cells having a series circuit of a non-ohmic element and a variable resistance element; and a control circuit configured to apply a control voltage, which is necessary for the variable resistance element to transit from a low resistance state to a high resistance state, to a selected memory cell through a selected first wiring and a selected second wiring, when applying the control voltage to the memory cell plural times, the control circuit operative to set a value of the control voltage applied in a first control voltage application operation to be equal to or less than a minimum value of distribution of the voltage values of all the memory cells in the memory cell array required to transit the resistance state of the variable resistance element in the memory cell from the high resistance state to the low resistance state, the control circuit operative to perform a plurality of control voltage application operations by increasing the value of the control voltage by a certain value in each of second and subsequent control voltage application operations, and the certain value being a difference between a minimum value of the distribution of the voltage value of one memory cell in the memory cell array required to transit the resistance state of the variable resistance element of the memory cell from the high resistance state to the low resistance state and a maximum value of the distribution of the voltage value of one memory cell required to transit the resistance state of the variable resistance element of the memory cell from the low resistance state to the high resistance state.

Still another aspect of the present invention provides a semiconductor storage device comprising: a memory cell array including a plurality of first wirings, a plurality of second wirings intersecting the first wirings, and memory cells positioned at intersecting portions between the first wirings and the second wirings, each of the memory cells having a series circuit of a non-ohmic element and a variable resistance element; and a control circuit configured to apply a control voltage, which is necessary for the variable resistance element to transit from a low resistance state to a high resistance state, to a selected memory cell through a selected first wiring and a selected second wiring, when applying the control voltage to the memory cell plural times, the control circuit operative to perform a plurality of control voltage application operations by increasing the value of the control voltage by a certain value in each control voltage application operation, and the certain value being a difference between a minimum value of the distribution of the voltage value of one memory cell in the memory cell array required to transit the resistance state of the variable resistance element of the memory cell from the high resistance state to the low resistance state and a maximum value of the distribution of the voltage value of one memory cell required to transit the resistance state of the variable resistance element of the memory cell from the low resistance state to the high resistance state.

DETAILED DESCRIPTION OF THE EMBODIMENTS

Embodiments of the present invention will now be described below with reference to the accompanying drawings. In the disclosed embodiments, a semiconductor storage device is described as a resistive memory device having a three-dimensional memory cell array structure with laminated memory cell arrays. Of course, this configuration, however, is intended to be exemplary only, and not a limitation upon the present invention.

Figure 1:
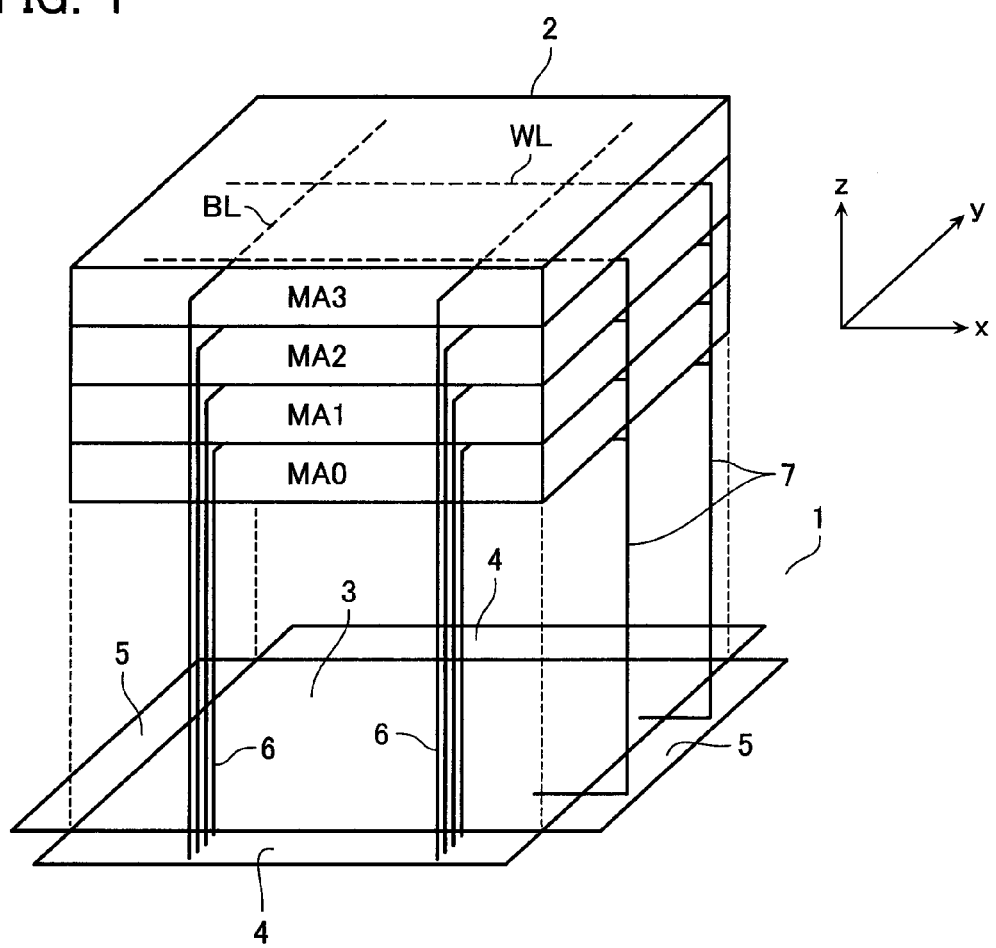
FIG. 1 is a perspective view illustrating a configuration of a resistive memory device according to an embodiment.

FIG. 1 illustrates a basic configuration of a resistive memory device according to an embodiment of the present invention, i.e., configuration of a wiring region 3, in which wirings such as global buses are formed on a semiconductor substrate 1, and a memory block 2 laminated thereon.

In the case of FIG. 1, the memory block 2 includes four layers of memory cell arrays MA0 to MA3. The wiring region 3 is provided on the semiconductor substrate 1 immediately below the memory block 2. The wiring region has, for example, global buses provided thereon for communicating data written to and read from the memory block 2 with the external. As described below, a column control circuit including a column switch, etc., and a row control circuit including a row decoder, etc., may also be provided on the wiring region 3.

It is necessary to provide vertical wirings (via contacts) on the side surface of the memory block 2 for connecting word lines WL and bit lines BL of the laminated memory cell arrays MA to the wiring region 3 formed on the semiconductor substrate 1. The wiring region 3 has bit-line contact regions 4 and word-line contact regions 5 provided on its four sides. The bit-line contact regions 4 and the word-line contact regions 5 have bit-line contacts 6 and word-line contacts 7 formed therein for connecting the bit lines BL and the word lines WL to the control circuits. Each of the word lines WL is connected to the wiring region 3 via a respective word-line contact 7, one end of which is formed on one of the word-line contact regions 5. In addition, each of the bit lines BL is connected to the wiring region 3 via a respective bit-line contact 6, one end of which is formed on one of the bit-line contact regions 4.

Although FIG. 1 illustrates one memory block 2 with multiple memory cell arrays MA laminated therein in a direction perpendicular to the semiconductor substrate 1 (the z direction of FIG. 1), a plurality of such memory blocks 2 are, in fact, arranged in a matrix form in a direction in which the word line WL extends (the x direction of FIG. 1) as well as in a direction in which the bit lines BL extends (the y direction of FIG. 1).

As illustrated in FIG. 1, in the one word-line contact region 5 according to this embodiment, only one line of word-line contacts 7, i.e., those word lines WL in all layers of one cross section are connected to the wiring region 3 via respective common contacts. In addition, in the one bit-line contact region 4, the bit lines BL in each layer are connected to the wiring region 3 via four lines of contacts separately prepared for each layer. Although the bit lines BL are independently driven for each layer and the word lines WL are connected in common in all layers in this embodiment, the word lines WL may also be independently driven for each layer. Alternatively, the bit lines BL may also be connected in common and the word lines WL may be independently driven. Moreover, at least one of the bit lines BL and the word lines WL may be configured to be shared between the upper and lower layers.

Figure 2:
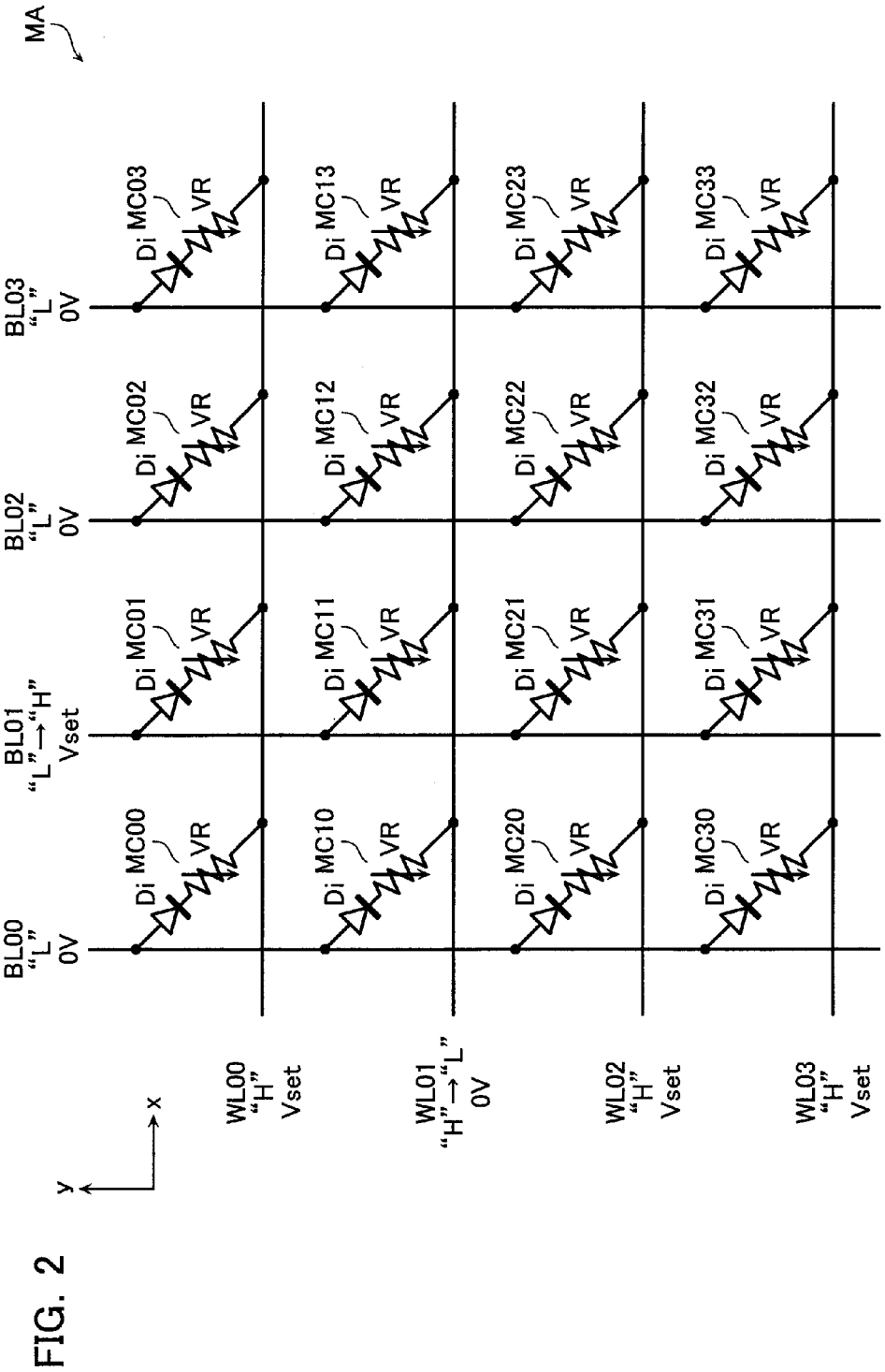
FIG. 2 is an equivalent circuit diagram of a memory cell array in the resistive memory device according to the embodiment.

FIG. 2 is an equivalent circuit diagram of a memory cell array MA in the resistive memory device. In this case, the memory cell array MA illustrated in FIG. 2 has a plurality of unit memory cells MC arranged in a direction in which the bit lines BL extend (the y direction of FIG. 2) as well as in a direction in which the word lines WL extend (the x direction of FIG. 2), respectively, in a two dimensional matrix form. As can be seen, resistance-varying type unit memory cells MC are positioned at intersections between word lines WL and bit lines BL, with rectifier elements, e.g., diodes Di, and variable resistance elements VR connected in series. It should be appreciated that a diode Di and a variable resistance element VR included in a memory cell MC are not limited to the arrangement or polarity as illustrated in the figures.

The variable resistance elements VR, which have, for example, a structure of electrode/transition metal oxide (binary system or ternary system)/electrode, provide a change in resistance value of a metal oxide depending on the conditions of applied voltage, current, heat, etc., and store the different states of the resistance values as information in a non-volatile manner. More specifically, the following can be used as the variable resistance elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence or presence of electric charges trapped by a charge trapping residing on the electrode interface; and the other is the type where a resistance change occurs depending on the absence or presence of a conductive path due to oxygen defect, etc.); and so on.

For unipolar-type ReRAM, data write to a memory cell MC, that is, set operation is performed by applying, for on the order of 10 ns to 100 ns, a voltage of, e.g., 1.5 V (in fact, on the order of 2.1 V if a voltage drop 0.6 V in the corresponding diode Di is included) and a current of on the order of 10 nA to a variable resistance element VR. As a result, the variable resistance element VR changes from a high resistance state to a low resistance state. As a factor of the above resistance change, there is considered, for example, a model in which when a high voltage is applied to the variable resistance element VR, internal cations (positive charge ions) move and a substance in an insulation state phase-changes to a series coupling state of electrochemically potentially (semi) stable conductive material. It is needless to say that there are considered other models because various models exist depending on substances.

On the other hand, data erase from a memory cell MC, that is, reset operation is performed by applying, for on the order of 500 ns to 2 μs, a voltage of 0.6 V (in fact, on the order of 1.6 V if a voltage drop 1.0 V in the corresponding diode Di is included) and a current of on the order of 1 μA to 10 μA to a variable resistance element VR in its low resistance state after the set operation. As a result, the variable resistance element VR changes from a low resistance state to a high resistance state. As a factor of the above resistance change, there is considered a model, for example, in which atoms are thermally diffused by Joule heat generated in the variable resistance element VR and change to an original thermal equilibrium state.

For example, a memory cell MC takes a high resistance state as a stable state (reset state). Data is written to the memory cell MC by such a set operation that causes a reset state to be switched to a low resistance state and data is erased from the memory cell MC by such a reset operation that causes a set state to be switched to a high resistance state for binary storage.

A read operation from a memory cell MC is performed by applying a voltage of 0.4 V (in fact, on the order of 1.2 V if a voltage drop 0.8 V in the corresponding diode Di is included) to a variable resistance element VR, and monitoring a current flowing through the variable resistance element VR. As a result, it is determined whether the variable resistance element VR is in its low resistance or high resistance state.

Referring again to FIG. 2, the set operation of the resistive memory device according to this embodiment will be described below. FIG. 2 illustrates the states of voltage applied to the bit lines BL and the word lines WL connected to a memory cell array MA in the set operation of a memory cell MC. In this case, given that the selected memory cell MC to which data is to be written by the set operation is MC11.

Non-selected bit lines BL00, BL02, and BL03 that are not connected to the selected memory cell MC11 are in "L" state (in this embodiment, Vss=0 V). During the set operation, the selected bit line BL01 that is connected to the selected memory cell MC11 is driven from "L" state (Vss=0 V) to "H" state (in this embodiment, voltage Vset). In addition, non-selected word lines WL00, WL02, and WL03 that are not connected to the selected memory cell MC11 are in "H" state (in this embodiment, voltage Vset). During the set operation, the selected word line WL01 that is connected to the selected memory cell MC11 is driven from the "H" state (voltage Vset) to "L" state (in this embodiment, voltage Vss=0 V). As a result, the diode Di in the selected memory cell MC11 is turned to a forward-biased state, which causes current to flow therethrough. Then a potential difference Vset is applied to the selected memory cell MC11 and the corresponding variable resistance element VR changes from a high resistance state to a low resistance state, after which the set operation is completed.

Figure 3:
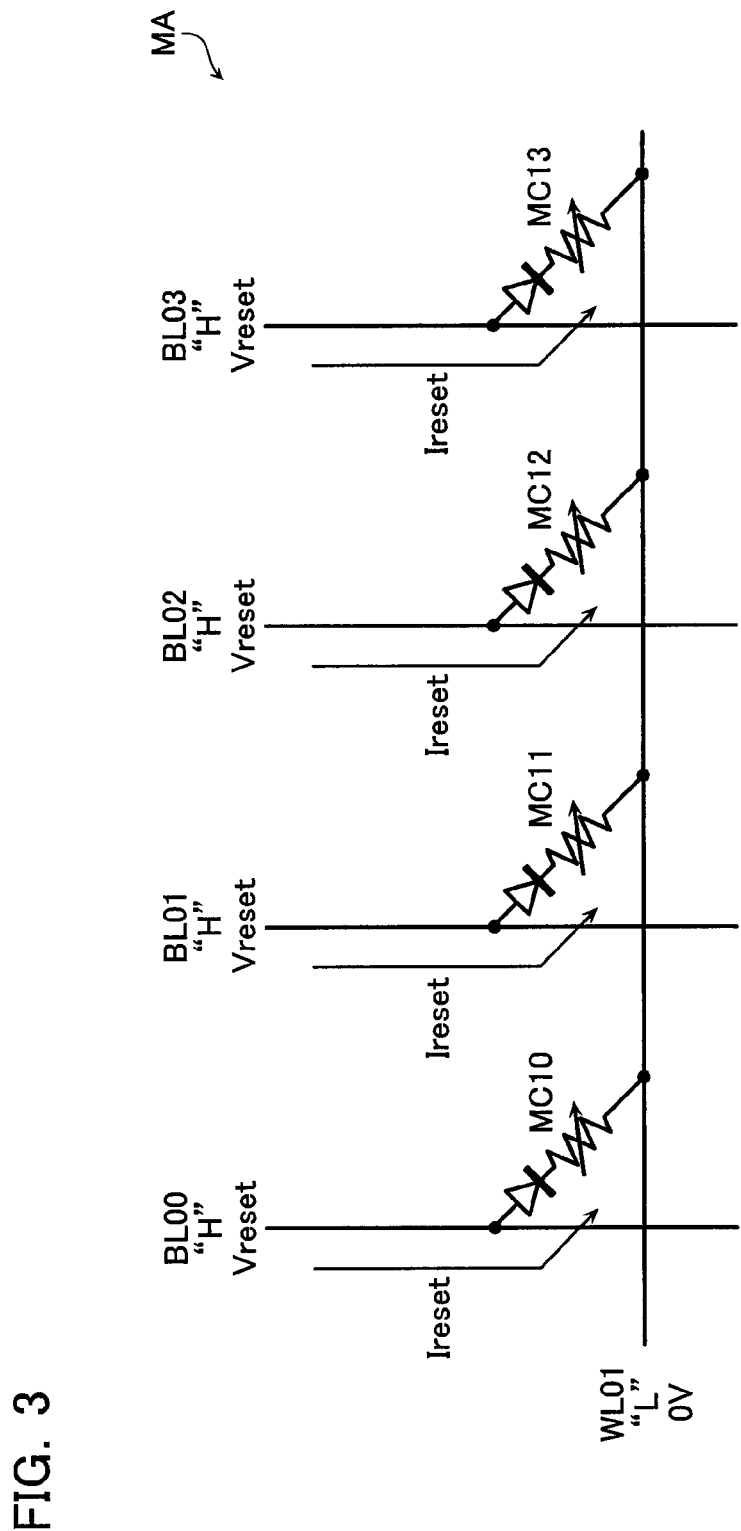
FIG. 3 is an equivalent circuit diagram of a memory cell array in the resistive memory device according to the embodiment.

Next, the reset operation of the resistive memory device according to this embodiment will be described with reference to FIG. 3. FIG. 3 is an equivalent circuit diagram of the memory cell array MA in the resistive memory device. In FIG. 3, the same components as those shown in FIG. 2 are denoted by the same reference numerals and a description thereof will be omitted. The memory cell array MA shown in FIG. 3 has the same structure as the memory cell array MA shown in FIG. 2. Therefore, in FIG. 3, the structure of the word lines WL00, WL02, and WL03 is omitted.

FIG. 3 shows the state of voltage and current applied to the bit lines BL and the word lines WL that are connected to the memory cell array MA during the reset operation of the memory cell MC. Here, it is assumed that data is erased in parallel (i.e., at the same time) from four selected memory cells MC10 to MC13 by the reset operation.

During the reset operation, the selected bit lines BL00 to BL03 connected to the selected memory cells MC10 to MC13 are driven in an "H" state (in this embodiment, a voltage Vreset). In addition, during the reset operation, the selected word line WL01 connected to the selected memory cells MC10 to MC13 is driven in an "L" state (in this embodiment, a voltage Vss=0 V). Although not shown in FIG. 3, the non-selected word lines WL00, WL02, and WL03 that are not connected to the selected memory cells MC10 to MC13 are in the "H" state (for example, the voltage Vreset). When a voltage is applied to the selected bit lines BL00 to BL03, a forward bias is applied to the diodes Di of the selected memory cells MC10 to MC13. A reset current Ireset capable of performing the reset operation flows to each memory cell MC. A potential difference Vreset is applied to the selected memory cell MC11 and the variable resistance element VR is changed from the low resistance state to the high resistance state. In this way, the reset operation is completed.

The resistive memory device according to this embodiment repeatedly performs an operation of applying a reset pulse and a reset verifying operation of detecting the resistance state of the memory cell until the states of a plurality of memory cells MC performing the reset operations in parallel are changed. After applying each reset pulse, the resistive memory device performs the reset verifying operation to detect whether the state of the memory cell MC is changed. The reset pulse is not applied to the memory cell MC that has been changed to the high resistance state, and the reset operation ends. On the other hand, the reset pulse is applied again to the memory cell MC maintained in the low resistance state to continuously perform the reset operation. The reset operation ends when the resistance states of all the memory cells MC to be subjected to the reset operation are changed to the high resistance state. The reset operation may be completed on the basis of other conditions, such as when a predetermined amount of time has elapsed after the start of the reset operation.

Voltages required to change the resistance states of the memory cells MC are different from each other due to a variation in the characteristics of the variable resistance elements VR of the memory cells MC. Therefore, during a plurality of reset pulse application operations, it is possible to sequentially increase the reset voltage Vreset applied to the bit lines BL00 to BL03 by a predetermined value (V$\alpha$) to obtain a voltage Vreset, a voltage Vreset+V$\alpha$, a voltage Vreset+2*V$\alpha$, ..., a voltage Vreset+n*V$\alpha$. All the memory cells MC including a memory cell MC whose resistance state is changed by a high voltage are changed from the low resistance state to the high resistance state by the sequentially increased reset voltage Vreset+n*V$\alpha$, and the reset operation is completed. The value of the reset voltage Vreset applied at the beginning of the reset pulse application operation and the value of the increment V$\alpha$ of the reset voltage will be described in detail later.

Figure 4:
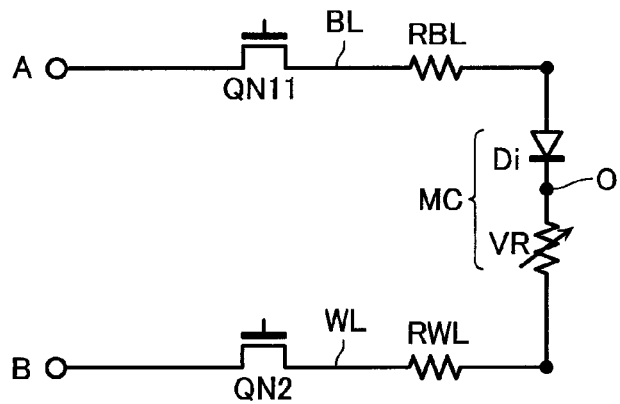
FIG. 4 is a diagram for explaining the operation of a memory cell of the resistive memory device according to the embodiment.

FIG. 4 is a diagram schematically illustrating a current path of one memory cell MC arranged at the intersection of one bit line BL and one word line WL. A transistor QN11 (which will be described below), serving as a bit line selection transistor, is connected to one end of the bit line BL, and a transistor QN2 (which will be described below), serving as a word line selection transistor, is connected to one end of the word line WL. In addition, resistors RBL and RWL shown in FIG. 4 are the parasitic resistances of the bit line BL and the word line WL. The other end of the bit line selection transistor QN11 is connected to a node A connected to a column control circuit, which will be described below. In addition, the other end of the word line selection transistor QN2 is connected to a node B connected to the row control circuit, which will be described below. In this embodiment, it is assumed that a connecting portion between the variable resistance element VR and the diode Di is a node O.

Figure 5A:
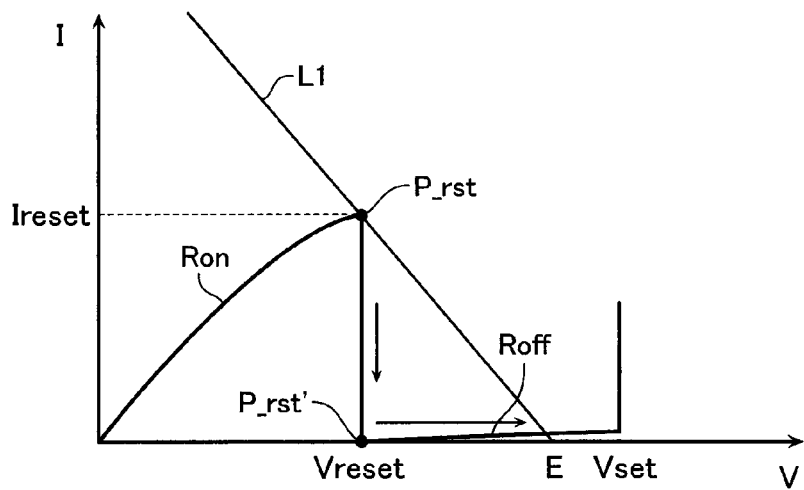
FIG. 5A is a graph illustrating the relationship between a current and a voltage when the resistive memory device according to the embodiment is operated.
Figure 5B:
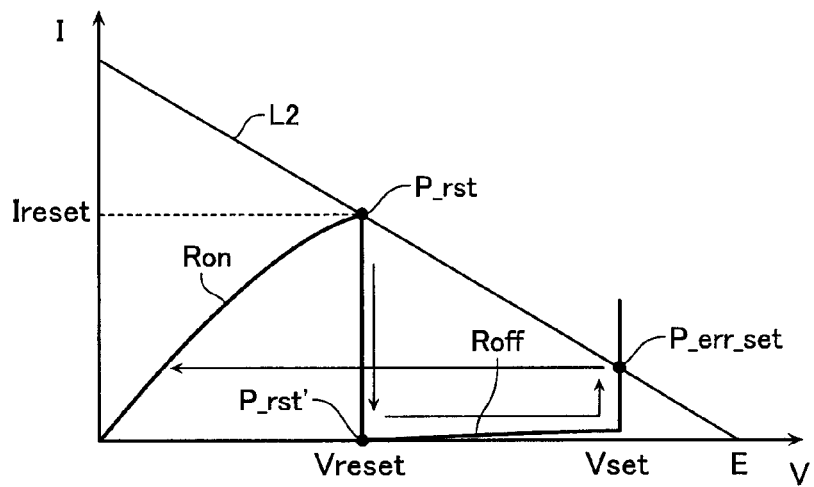
FIG. 5B is a graph illustrating the relationship between the current and the voltage when the resistive memory device according to the embodiment is operated.

FIGS. 5A and 5B are operation point analysis diagrams when the reset operation is performed through the current path shown in FIG. 4. FIGS. 5A and 5B show voltage-current characteristics (V=IR) in the reset state (high resistance state Roff) and the set state (low resistance state Ron) of the variable resistance element VR. In addition, FIGS. 5A and 5B show load characteristics L1 and L2 of the parasitic resistances of the diode Di and the wiring, respectively. When the parasitic resistances of the diode Di and the wiring are small, the gradient of the load characteristics is large (L1 in FIG. 5A). When the parasitic resistances are large, the gradient of the load characteristics is small (L2 in FIG. 5B). In FIGS. 5A and 5B, the horizontal axis indicates a voltage V and the vertical axis indicates a current I.

First, the reset operation of the resistive memory device when the parasitic resistances of the diode Di and the wiring are small will be described with reference to FIG. 5A. During the reset operation, when a voltage E is applied to the wiring node A shown in FIG. 4, the voltage Vreset is applied to the node O of the memory cell MC due to a voltage drop by the resistance of the wiring and the diode Di. As shown in FIG. 5A, an operation point is P_rst. The operation point P_rst is for changing the low resistance state Ron ("0" data) of the memory cell to the high resistance state Roff ("1" data). At the operation point P_rst, a current Ireset required for the reset operation flows to the memory cell MC.

When the variable resistance element VR is changed to the high resistance state by the reset operation, the operation point is changed from P_rst in the low resistance state Ron (before the reset operation is completed) to P_rst' in the high resistance state Roff (after the reset operation is completed). In this case, since it is difficult for the current to flow to the memory cell MC in the high resistance state, the operation point is moved to a high voltage side along the current-voltage characteristics Roff in the high resistance state. However, the voltage applied to the memory cell MC can not exceed the voltage E applied to the node A of the wiring. When the parasitic resistances of the diode Di and the wiring are small, the voltage E applied to the wiring node A is lower than the set voltage Vset required to set the memory cell MC. Therefore, a voltage enough to set the memory cell MC is not applied to the memory cell MC after the reset operation is completed.

Next, the reset operation of the resistive memory device when the parasitic resistances of the diode Di and the wiring are large will be described with reference to FIG. 5B. During the reset operation, when the voltage E is applied to the wiring node A shown in FIG. 4, the voltage Vreset is applied to the node O of the memory cell MC due to a voltage drop by the resistance of the wiring and the diode Di. As shown in FIG. 5B, an operation point is P_rst. The operation point P_rst is for changing the low resistance state Ron ("0" data) of the memory cell to the high resistance state Roff ("1" data). At the operation point P_rst, the current Ireset required for the reset operation flows to the memory cell MC.

When the variable resistance element VR is changed to the high resistance state by the reset operation, the operation point is changed from P_rst in the low resistance state Ron (before the reset operation is completed) to P_rst' in the high resistance state Roff (after the reset operation is completed). In this case, since it is difficult for the current to flow to the memory cell MC in the high resistance state, the operation point is moved to a high voltage side along the current-voltage characteristics Roff in the high resistance state. Since the parasitic resistances of the diode Di and the wiring are large, the voltage E applied to the node A of the wiring exceed the set voltage Vset required for the set operation of the memory cell MC. Therefore, after the reset operation is completed, the operation point becomes P_err_set. At the operation point P_err_set, the voltage Vset at which the set operation of the memory cell MC is performed is applied. Therefore, immediately after the reset operation is completed, the memory cell MC is likely to be erroneously set again (set error). When the memory cell MC is erroneously set, the operation point is moved to the low resistance state Ron. As a result, the reset operation is performed again, and the reset operation is not normally completed.

Figure 6A:
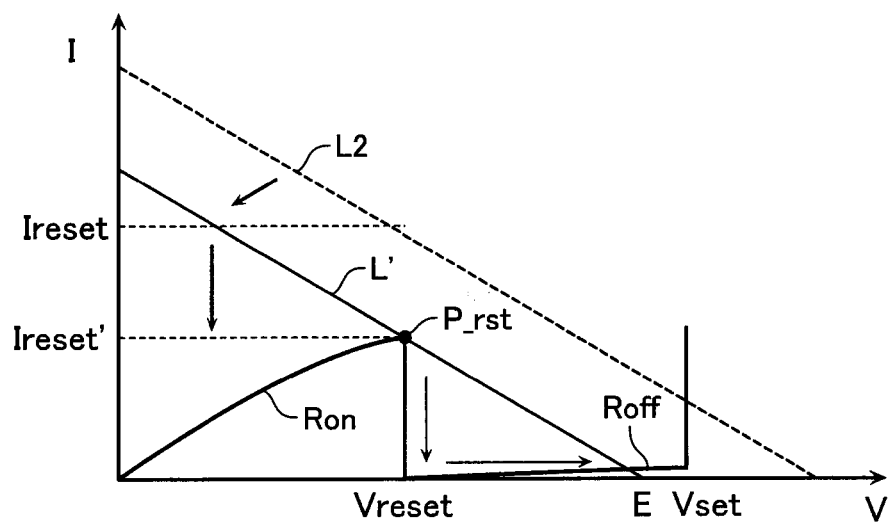
FIG. 6A is a graph illustrating the relationship between the current and the voltage when the resistive memory device according to the embodiment is operated.
Figure 6B:
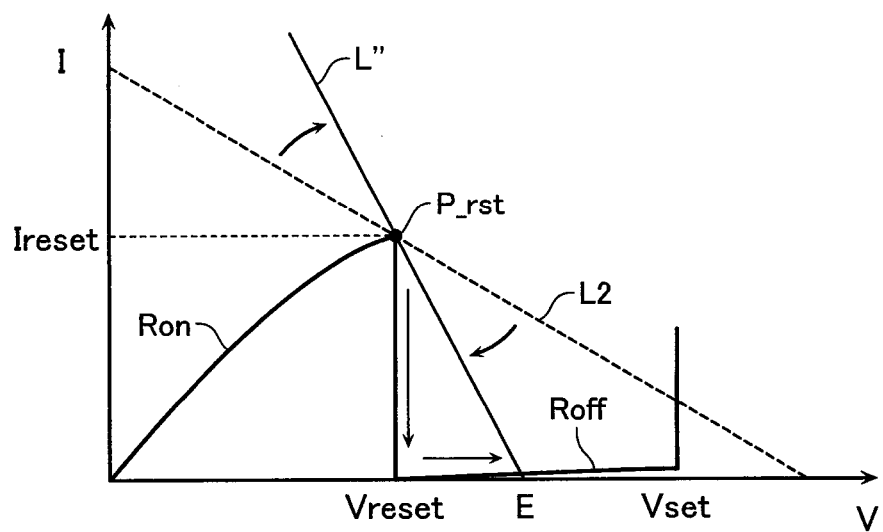
FIG. 6B is a graph illustrating the relationship between the current and the voltage when the resistive memory device according to the embodiment is operated.
Figures 6C, 7:
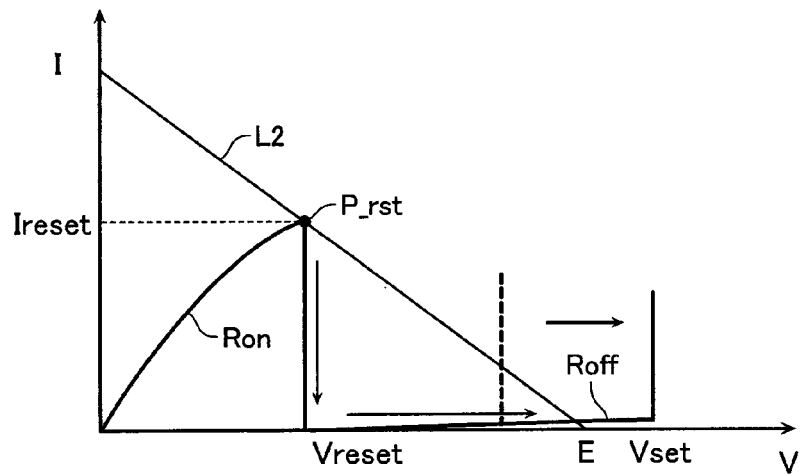
FIG. 6C is a graph illustrating the relationship between the current and the voltage when the resistive memory device according to the embodiment is operated.
FIG. 7 is a table for explaining the operation conditions of the resistive memory device according to the embodiment.

A method of preventing the memory cell MC from being erroneously set after the reset operation will be described with reference to FIGS. 6A to 6C. FIGS. 6A to 6C are operation point analysis diagrams when the reset operation is performed, which are the same as those shown in FIGS. 5A and 5B.

In order to prevent the erroneous setting of the memory cell MC after the reset operation shown in FIG. 5B, it is possible to reduce the reset current Ireset required to perform the reset operation, as shown in FIG. 6A. When the reset current is reduced to Ireset', the value of the voltage drop caused by the parasitic resistances of the diode Di and the wiring is also reduced. Therefore, the load characteristics L' of the parasitic resistances of the diode Di and the wiring are moved to the lower side of the graph. In this case, the voltage E applied to the wiring node A may be lower than the voltage Vset required for the set operation. As a result, the erroneous setting of the memory cell MC after the reset operation does not occur.

In addition, in order to prevent the erroneous setting of the memory cell MC after the reset operation, it is possible to reduce the parasitic resistances of the diode Di and the wiring, as shown in FIG. 6B. When the parasitic resistances of the diode Di and the wiring are reduced, the gradient of load characteristics L" of the parasitic resistances of the diode Di and the wiring is large. In this case, the voltage E applied to the wiring node A may be lower than the voltage Vset required for the set operation. As a result, it is possible to prevent the memory cell MC from being erroneously set after the reset operation.

As shown in FIG. 6C, a method of increasing the voltage Vset required for the set operation is also considered. In this case, as shown in FIG. 6C, since the set voltage Vset is increased, the voltage E applied to the wiring node A does not exceed the voltage Vset required for the set operation. Therefore, it is also possible to prevent the memory cell from being erroneously set after the reset operation.

However, there are limitations caused by the structure of the resistive memory device in the above-mentioned method of preventing the memory cell from being erroneously set after the reset operation. For example, even though the reset current Ireset is reduced, the reset current is not less than a read current required for a read operation. In addition, it is preferable that the parasitic resistance of the diode Di or the wiring be as small as possible. However, it is difficult to completely remove the influence of the parasitic resistance in terms of the structure of the memory cell array. It is difficult to set the set voltage Vset to be more than the maximum value determined by, for example, the breakdown voltage of the bit line selection transistor QN11. Therefore, the current/voltage values during the operation or the resistance of the wiring is given as a predetermined condition depending on the structure of the resistive memory device.

FIG. 7 is a table illustrating the operation conditions of the resistive memory device according to this embodiment, such as current and voltage values. FIG. 7 shows an example of the characteristics of the variable resistance element VR and the diode Di used in the resistive memory device.

The voltages Vset required for the set operations of the variable resistance elements VR are different from each other due to a variation in the characteristics of the variable resistance elements VR. The average value of the voltage Vset is 1.53 V. In addition, a standard deviation σ is 0.25 V, and 3σ is 0.75 V. That is, about 99.7% of the memory cells MC may be set in the range of 1.53 V±0.75 V. The average value of the voltage Vreset required for the reset operation is 0.64 V, the standard deviation σ is 0.11 V, and 3σ is 0.33 V. During the set operation, the average value of the voltage drop in the diode Di is 0.6 V, and 3σ is 0.1 V. During the reset operation, the average value of the voltage drop in the diode Di is 1.0 V, and 3σ is 0.17 V.

The variable resistance element VR of the resistive memory device is in a permanently high resistance state in which the resistance value thereof is not changed immediately after the resistive memory device is manufactured. An operation (forming operation) of applying a certain voltage to the variable resistance element in the high resistance state can be performed to change the resistance state of the variable resistance element VR, and the variable resistance element functions as a memory element. A voltage Vforming required for the forming operation is in the range of 5 V to 10 V, as shown in FIG. 7. In addition, current values required for the set operation and the reset operation of the memory cell MC are 3.75 nA and 9.24 µA, respectively. The resistance of one bit line or one word line is 1.5Ω. The wiring resistance of the entire memory cell array including 4 k (4×10³) memory cells arranged in the bit line direction and 1 k (1×10³) memory cells arranged in the word line direction is about 16 kΩ.

Figure 8A:
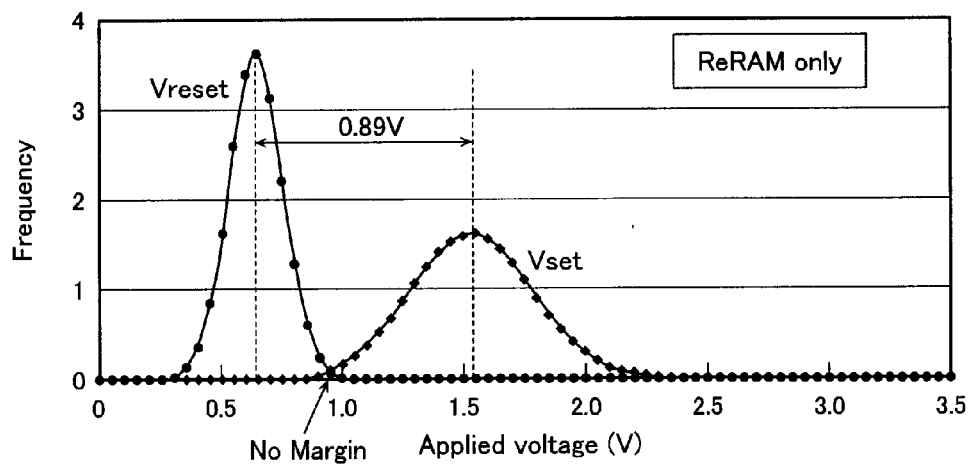
FIG. 8A is a graph for explaining the operation conditions of the resistive memory device according to the embodiment.
Figure 8B:
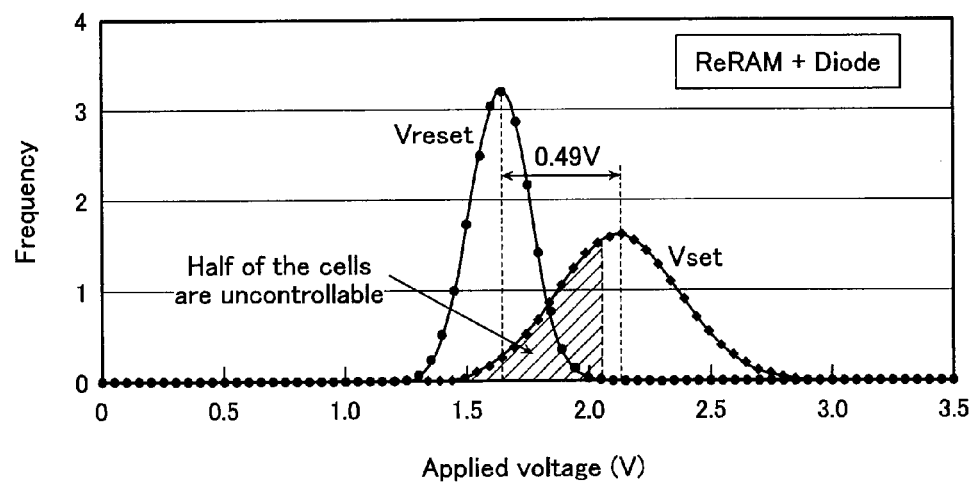
FIG. 8B is a graph for explaining the operation conditions of the resistive memory device according to the embodiment.
Figure 8C:
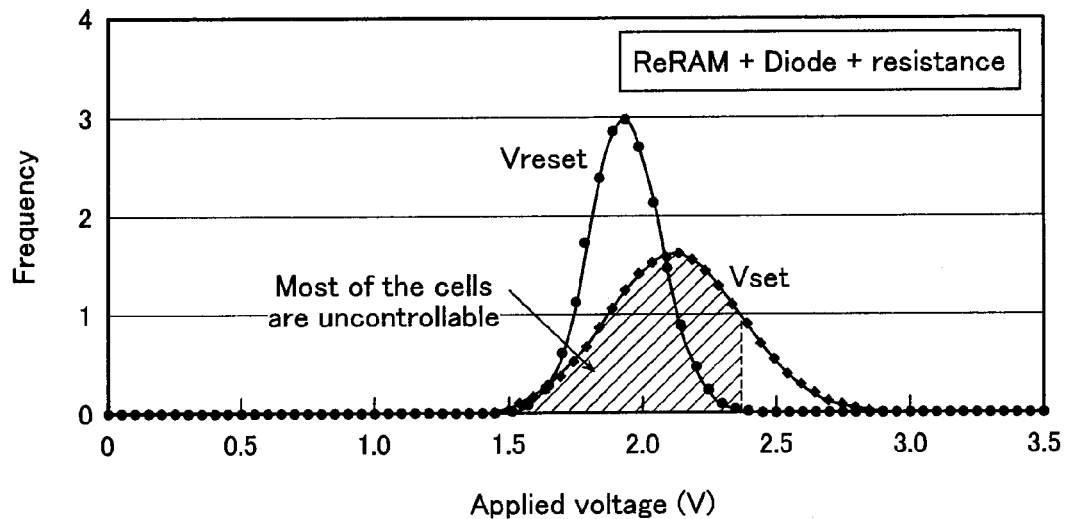
FIG. 8C is a graph for explaining the operation conditions of the resistive memory device according to the embodiment.

In the resistive memory device according to this embodiment, the problems posed when the reset operation is simultaneously performed on a plurality of memory cells will be described. FIGS. 8A to 8C are graphs for explaining the operation conditions of the resistive memory device. In FIGS. 8A to 8C, the horizontal axis indicates a voltage applied, and the vertical axis indicates the frequency of change in the state of the memory cell due to the applied voltage. FIG. 8A shows a case in which a voltage is applied to only the variable resistance element VR, FIG. 8B shows a case in which a voltage is applied to the memory cell MC in which the variable resistance element VR and the diode Di are connected to each other, and FIG. 8C shows a case in which a voltage is applied to the memory cell MC through the wiring and the wiring selection transistor. In the examples shown in FIGS. 8A to 8C, it is assumed that eight memory cells MC are selected in the memory cell array including 4×10⁶ memory cells in total, i.e., 4 k (4×10³) memory cells arranged in the bit line direction and 1 k (1×10³) memory cells arranged in the word line direction. In addition, a voltage drop of 0.18 V occurs in the bit line selection transistor QN11 and the word line selection transistor QN2 and a voltage drop of 0.22 V occurs in the wiring.

As shown in FIG. 7, when a voltage is applied to only the variable resistance element VR, the average value of the voltage required for the reset operation of the variable resistance element VR is 0.64 V, and the average value of the voltage required for the set operation is 1.53 V. As shown in the distribution of FIG. 8A, the difference between the average values of the voltages required for the reset and set operations is 0.89 V. However, when a variation in the operation voltage due to the characteristics of the variable resistance element VR is considered, it is necessary to apply a reset voltage of about 0.64 V+0.33 V in order to reliably perform the reset operation. In this case, there is no margin between the reset voltage and the lower limit (1.53 V−0.75 V) of the distribution of the set voltage at which the set operation of the variable resistance element VR is performed.

When a voltage is applied to the memory cell MC in which the variable resistance element VR and the diode Di are connected to each other, the voltage drop caused by the diode Di is in the range of 0.6 V±0.1 V during the set operation and in the range of 1.0 V±0.17 V during the reset operation. It is necessary to apply to the memory cell MC a voltage obtained by adding the voltage drop caused by the diode Di to the voltage required for each operation of the variable resistance element VR. In this case, a voltage of about 2.14 V is applied to the memory cell MC in order to reliably perform the reset operation. Therefore, as shown in the distribution of FIG. 8B, the difference between the average values of the voltages required for the reset and set operations is reduced to 0.49 V. Therefore, about half of the number of memory cells MC in the memory cell array is set by the reset voltage. That is, the reset operation of half of the number of memory cells MC is not normally performed.

As shown in FIG. 8C, when the wiring resistance or a voltage drop in the transistor is considered in addition to the memory cell MC, the voltage required for the reset operation is further increased. The reset voltage applied to reliably perform the reset operation is more than an initial voltage required for the set operation of the memory cell MC. As a result, the resistive memory device is out of control.

Figure 9A:
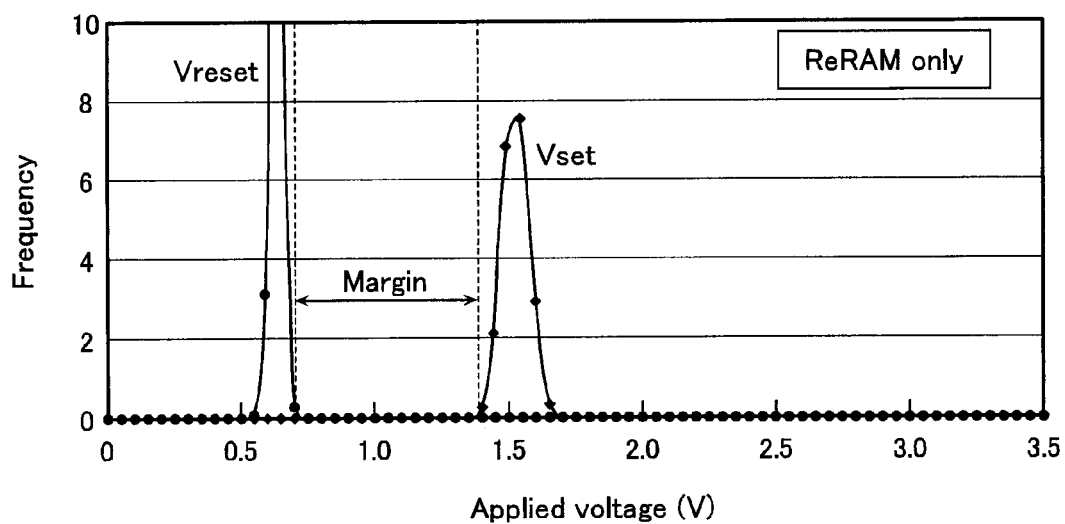
FIG. 9A is a graph for explaining the operation conditions of the resistive memory device according to the embodiment.
Figure 9B:
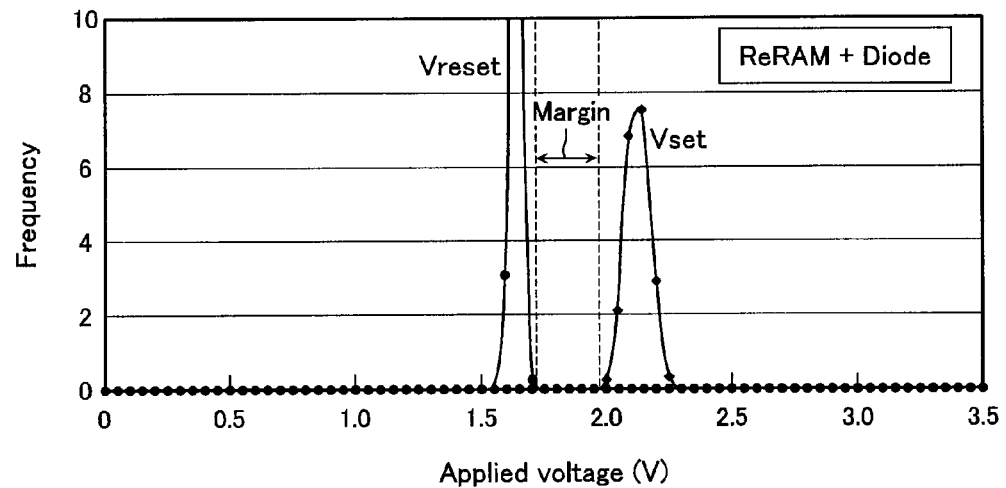
FIG. 9B is a graph for explaining the operation conditions of the resistive memory device according to the embodiment.
Figure 9C:
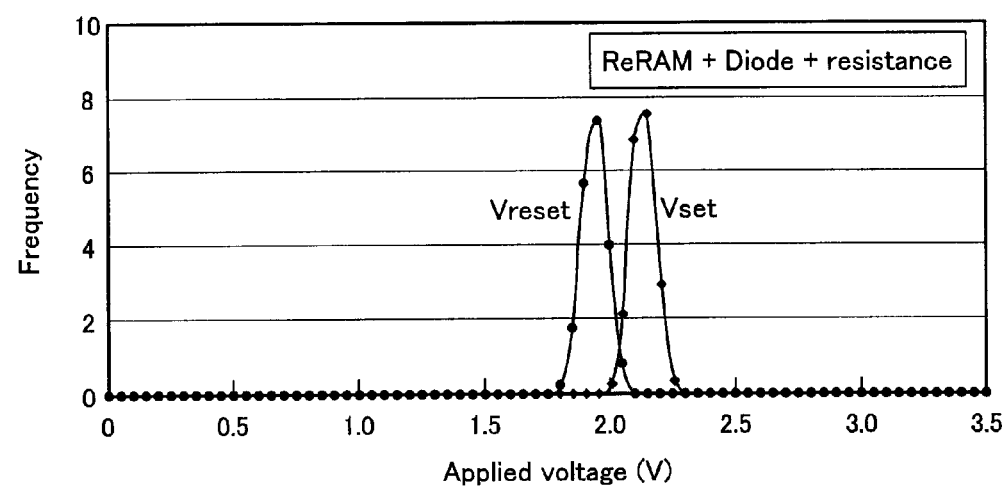
FIG. 9C is a graph for explaining the operation conditions of the resistive memory device according to the embodiment.

In the resistive memory device according to this embodiment, a case in which the reset operation is performed on one memory cell MC is considered. FIGS. 9A to 9C are graphs for explaining the operation conditions of one memory cell MC of the resistive memory device. In FIGS. 9A to 9C, the horizontal axis indicates a voltage applied, and the vertical axis indicates the frequency of change in the state of the memory cell due to the applied voltage. FIGS. 9A to 9C show the distribution when 20×10³ operations are repeatedly performed on one memory cell. FIG. 9A shows a case in which a voltage is applied to only the variable resistance element VR, FIG. 9B shows a case in which a voltage is applied to the memory cell MC in which the variable resistance element VR and the diode Di are connected to each other, and FIG. 9C shows a case in which a voltage is applied to the memory cell MC through the wiring and the wiring selection transistor.

As shown in FIG. 7, when a voltage is applied to only the variable resistance element VR, the average value of the voltage required for the reset operation of the variable resistance element VR is 0.64 V, and the average value of the voltage required for the set operation is 1.53 V. Even when the operation is repeatedly performed on one variable resistance element VR, the voltage required for the operation is changed due to, for example, the deterioration of the variable resistance element VR. However, the standard deviation a of the voltage required for the reset operation of one memory cell MC is 0.021 V, and the standard deviation a of the voltage required for the set operation of one memory cell MC is 0.049 V. This value is less than a variation in characteristics between a plurality of memory cells MC. Therefore, as shown in the distribution of FIG. 9A, even though a variation in operation voltage due to, for example, the deterioration of the variable resistance element VR is considered, the margin between the upper limit of the distribution of the reset voltage capable of reliably performing the reset operation and the lower limit of the distribution of the set voltage at which the set operation of the variable resistance element VR is performed is ensured.

As shown in FIG. 9B, even though the voltage drop caused by the diode Di is considered, the margin between the upper limit of the distribution of the reset voltage of the memory cell MC and the lower limit of the distribution of the set voltage is ensured.

As shown in FIG. 9C, when the wiring resistance or a voltage drop in the transistor is considered in addition to the memory cell MC, the upper limit of the distribution of the reset voltage capable of reliably performing the reset operation is likely to reach the lower limit of the distribution of the set voltage of the memory cell MC. However, since the overlap between the two distributions is small, it is possible to ensure the margin by finely adjusting the operation voltage or current.

As shown in FIGS. 8A to 8C, when the reset operation is simultaneously performed on a plurality of memory cells MC in the memory cell array, the voltage applied during the reset operation exceeds the set voltage, which may cause an erroneous set operation. However, as shown in FIGS. 9A to 9C, when the reset operation is performed on each memory cell MC, it is possible to ensure the margin between the reset voltage and the set voltage.

In this way, the resistive memory device according to this embodiment repeatedly performs the reset pulse application operation and the reset verifying operation of detecting the resistance state of the memory cell until the states of a plurality of memory cells MC to be subjected to the reset operation are completely changed. That is, the resistive memory device sequentially increases the reset voltage Vreset applied to the bit line BL from a small value and applies the sequentially increased reset pulse. The resistive memory device ends the reset operation without applying the reset pulse to the memory cell that has been changed to the high resistance state. On the other hand, the resistive memory device applies the reset pulse of the increased voltage to the memory cell maintained in the low resistance state again and continuously performs the reset operation.

As described above, during a plurality of reset pulse application operations, the reset voltage Vreset applied to the bit line BL is sequentially increased by a certain value (Vα) to obtain a voltage Vreset, a voltage Vreset+Vα, the voltage Vreset+2*Vα, . . . , a voltage Vreset+n*Vα. The value of the reset voltage Vreset applied at the beginning of the reset pulse application operation and the value of the increment Vα of the reset voltage will be described in detail below.

Figure 10A:
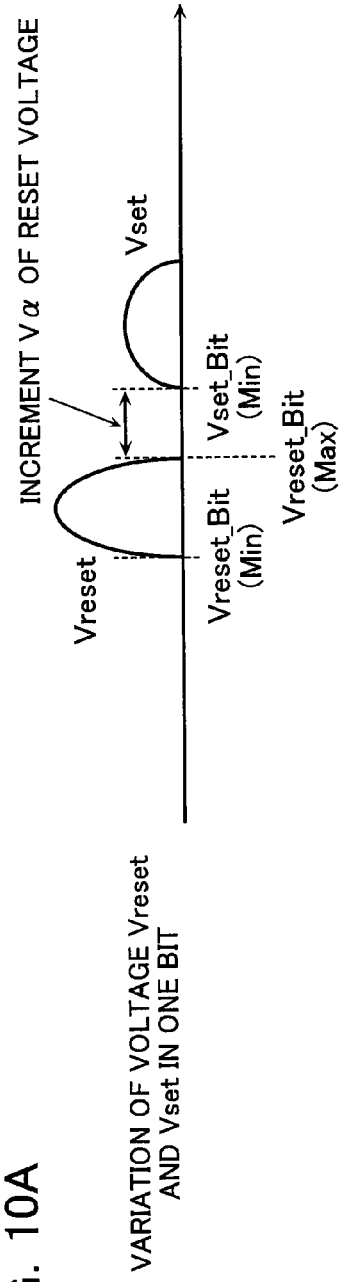
FIG. 10A is a diagram for explaining a voltage applied during a reset operation of the resistive memory device according to the embodiment.
Figure 10B:
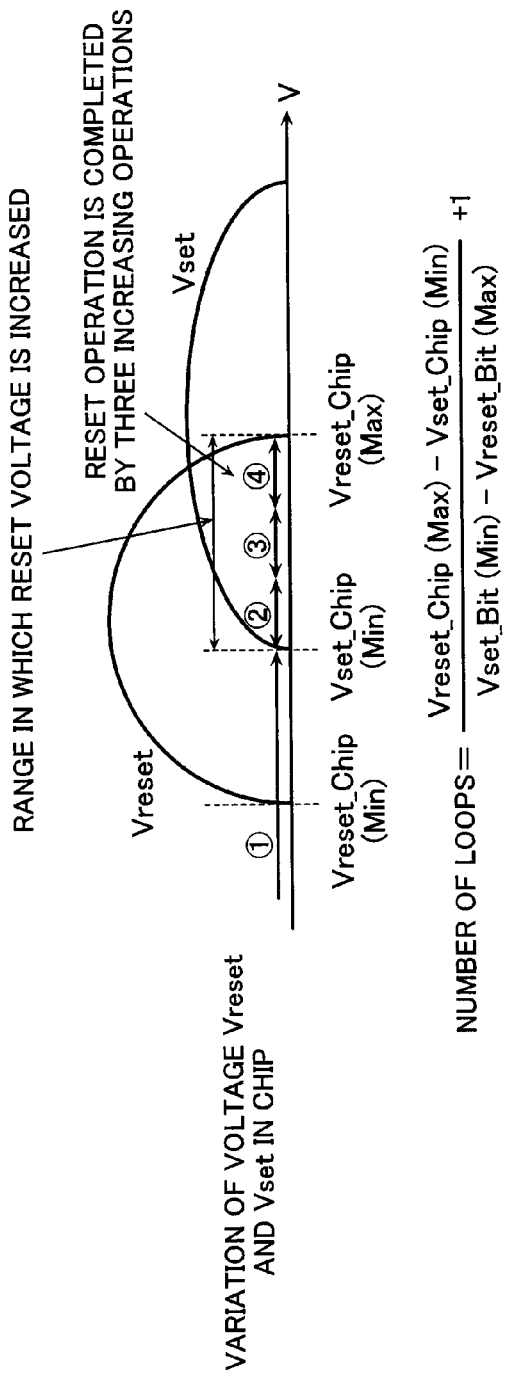
FIG. 10B is a diagram for explaining a voltage applied during the reset operation of the resistive memory device according to the embodiment.

FIGS. 10A and 10B are diagrams for explaining the voltages applied during the reset operation of the resistive memory device according to this embodiment. FIG. 10A schematically shows the distribution of the reset voltage and the set voltage of each one of memory cells MC shown in FIG. 9C. In FIG. 10A, the maximum value and the minimum value of the distribution of the voltage required for the reset operation of one memory cell MC are represented by Vreset_Bit (Max) and Vreset_Bit(Min), respectively, and the minimum value of the distribution of the voltage required for the set operation is represented by Vset_Bit(Min).

FIG. 10B schematically shows the distribution of the reset voltages and the set voltages of all the memory cells MC in the memory cell array shown in FIG. 8C. In FIG. 10B, the maximum value and the minimum value of the distribution of the voltage required for the reset operation of the memory cells MC in the memory cell array are represented by Vreset_Chip (Max) and Vreset_Chip(Min), respectively, and the minimum value of the distribution of the voltage required for the set operation is represented by Vset_Chip(Min).

First, the value of the reset voltage Vreset applied at the beginning of a plurality of reset pulse application operations will be described.

The value of the reset voltage applied during a first reset pulse application operation among the plurality of reset pulse application operations is substantially equal to the minimum value Vset_Chip(Min) of the distribution of the voltage required for the set operation of each memory cell MC in the memory cell array. An initial reset pulse is uniformly applied to each memory cell in the memory cell array. When a first reset voltage is referred to as Vset_Chip(Min), each memory cell in the memory cell array is not erroneously set by the reset voltage.

In this embodiment, the value of the first reset voltage is referred to as Vset_Chip(Min), but it may be any value equal to or less than Vset_Chip(Min). That is, the value of the first reset voltage may be in the range represented by number 1 in FIG. 10B. However, when the voltage value is less than Vreset_Chip(Min), the reset operation is not performed on any memory cell MC in the memory cell array. Therefore, it is preferable that the value of the first reset voltage be equal to or more than the minimum value Vreset_Chip(Min) of the distribution of the voltage required for the reset operation of the memory cell MC and equal to or less than the minimum value Vset_Chip(Min) of the distribution of the voltage required for the set operation.

Next, the value of the increment Vα of the reset voltage Vreset during a plurality of reset pulse application operations will be described.

During the reset operation of the resistive memory device according to this embodiment, the voltage value of the increment Vα of the reset voltage is substantially equal to a value obtained by subtracting the maximum value Vreset_Bit(Max) of the distribution of the reset voltage of one memory cell MC from the minimum value Vset_Bit(Min) of the distribution of the set voltage of the memory cell MC. As shown in FIG. 10A, in each one of memory cells MC, there is a margin between the maximum value Vreset_Bit(Max) of the distribution of the reset voltage and the minimum value Vset_Bit(Min) of the distribution of the set voltage. The margin is referred to as the increment Vα of the reset voltage.

The memory cells MC have different margins between the maximum value Vreset_Bit(Max) of the distribution of the reset voltage and the minimum value Vset_Bit(Min) of the distribution of the set voltage. In this case, in the memory cell array, the value of the memory cell MC in which the difference between the maximum value Vreset_Bit(Max) of the distribution of the reset voltage and the minimum value Vset_Bit(Min) of the distribution of the set voltage is the minimum value may be used as the increment Vα of the voltage.

In addition, a certain value may be defined as the difference between the maximum value Vreset_Bit(Max) of the distribution of the reset voltage of the memory cell MC and the minimum value Vset_Bit(Min) of the distribution of the set voltage, and the cell with a margin less than the certain value may be regarded as a defective cell and removed from the operation. In order to ensure a reset operation speed of several megabytes (MB) per second, it is preferable that the reset voltage with an increased level be applied about three times. In this case, about one-third of the difference between the maximum value Vreset_Chip(Max) of the distribution of the reset voltage of the memory cell MC in the memory cell array and the minimum value Vset_Chip(Min) of the distribution of the set voltage may be set as the certain value.

Figure 10C:
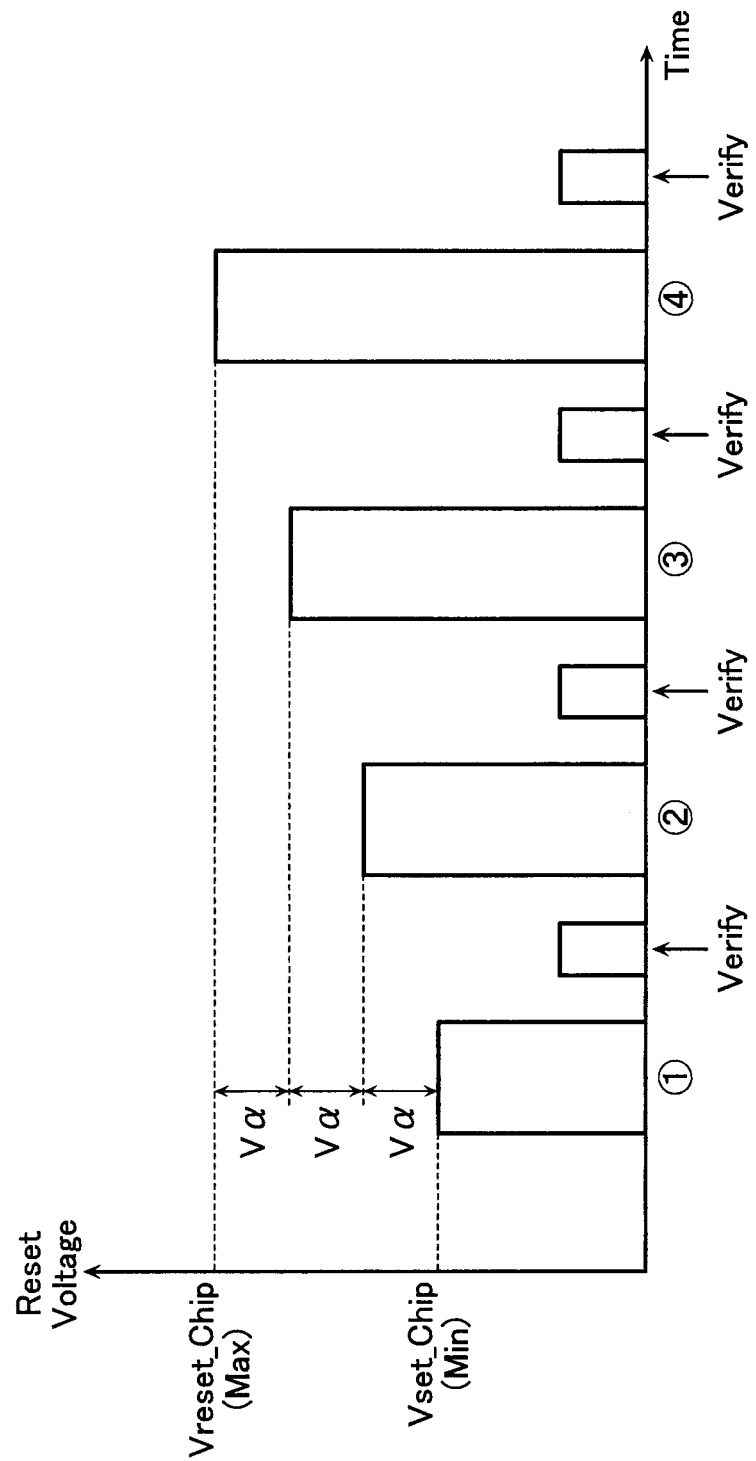
FIG. 10C is a diagram for explaining a voltage applied during the reset operation of the resistive memory device according to the embodiment.

As shown in FIGS. 10B and 10C, the resistive memory device according to this embodiment sequentially increases the applied voltage by a certain value (Vα) until the voltage reaches the voltage Vreset_Chip(Max), using the first reset voltage as Vset_Chip(Min), and then performs the reset operation. In addition, the resistive memory device performs the verifying operation to read the resistance state of the memory cell whenever the reset pulse is applied, and does not apply the reset pulse to the memory cell MC whose resistance state has been changed to the high resistance state. When the voltage of the reset pulse reaches Vreset_Chip(Max), the resistive memory device ends the reset operation. The number of times the voltage is increased during the period from the application of the first pulse to the end of the reset operation is represented by Equation 1 given below:

$$\{Vreset\_Chip(Max) - Vset\_Chip(Min)\}/\{Vset\_Bit(Min) - Vreset\_Bit(Max)\}. \quad \text{[Equation 1]}$$

The sum of the number given by the Equation 1 and the reset pulse applied first is the number of times the pulse is applied in the entire reset operation.

In the resistive memory device according to this embodiment, the voltage value of the increment Vα of the reset voltage is substantially equal to a value obtained by subtracting the maximum value Vreset_Bit(Max) of the distribution of the reset voltage of one memory cell from the minimum value Vset_Bit(Min) of the distribution of the set voltage of the memory cell. Therefore, the memory cell MC whose state has not been changed by the reset pulse applied in a certain reset pulse application operation may be changed to the reset state by the reset pulse applied in the next reset pulse application operation. However, the voltage required for the reset operation of the memory cell does not exceed the set voltage. Therefore, it is possible to prevent the memory cell MC from being erroneously set. This is because, if the reset voltage that has not reached the distribution of the reset voltage of a certain memory cell MC in the previous reset voltage application operation is increased by Vα in the next reset voltage application operation, it does not reach the distribution of the set voltage of the memory cell.

As described above, it is possible to prevent the memory cell from being erroneously set and achieve a stable reset operation by adjusting the increment Vα of the voltage applied and performing the reset pulse application operation and the reset verifying operation.

[Configuration of Control Circuit]

Figure 11:
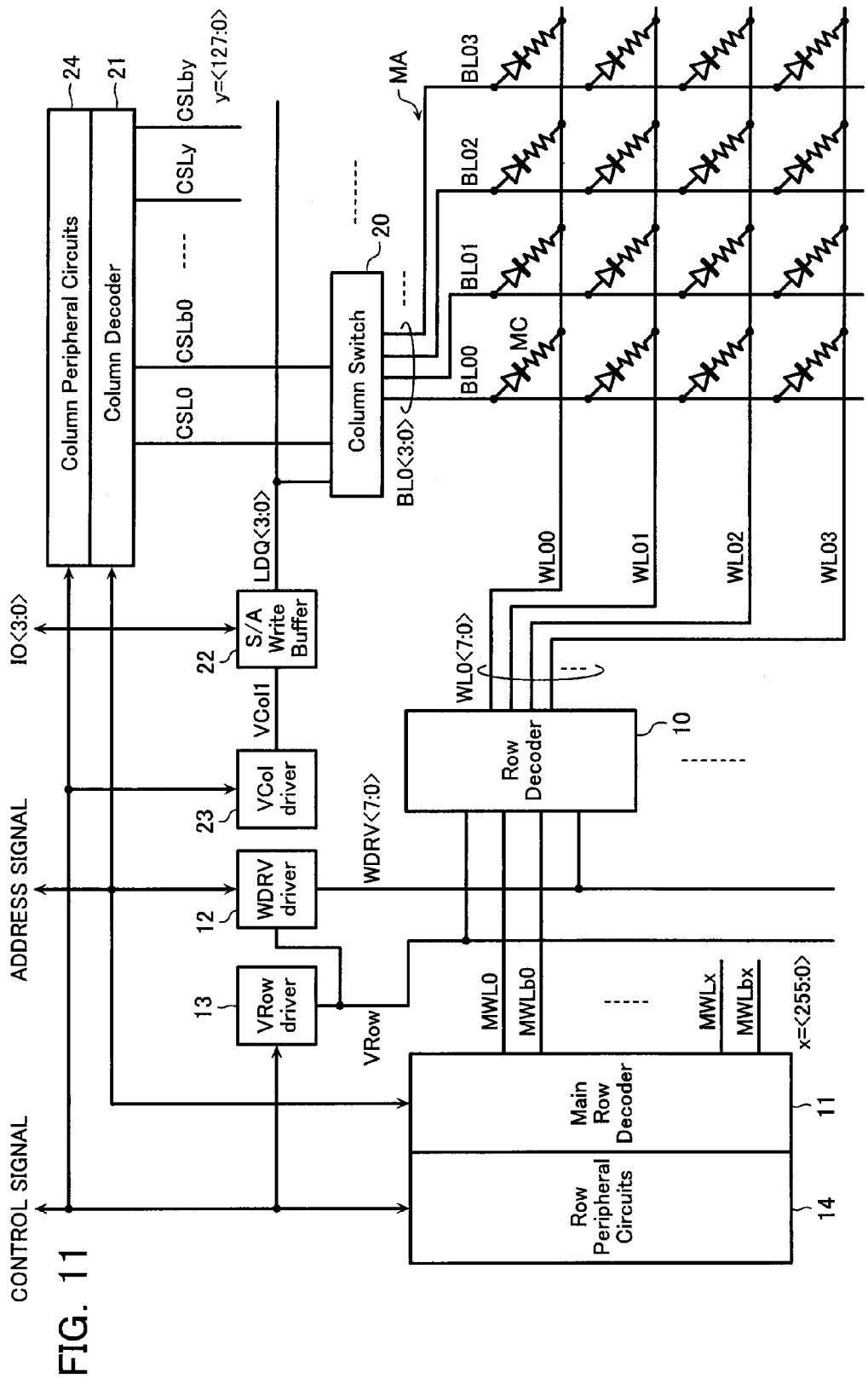
FIG. 11 is a block diagram illustrating an example arrangement of column/row control circuits in the resistive memory device according to the embodiment.

A circuit configuration of the resistive memory device to apply the reset voltage Vreset to the bit line BL and the voltage Vss to the word line WL01 will be described with reference to FIGS. 11 to 19. The case in which 2K-bit (2048-bit) memory cells MC are arranged in the direction of the word line, 512-bit memory cells MC are arranged in the direction of the bit line, and 1M-bit memory cells MC are arranged in the one memory cell array MA will be described by way of example. FIG. 11 is a block diagram illustrating an example of the arrangement of a column control circuit and a row control circuit in the resistive memory device.

Referring to FIG. 11, the row control circuit includes a row decoder 10, a main row decoder 11, a write drive line driver 12, a row power supply line driver 13, and a row-system peripheral circuit 14. The column control circuit includes a column switch 20, a column decoder 21, a sense amplifier/write buffer 22, a column power supply line driver 23, and a column-system peripheral circuit 24.

The word line WL of the embodiment has a hierarchical structure, and the main row decoder 11 selectively drives one of 256 pairs of main word lines MWLx and MWLbx (x=<255:0>). For example, in the selected main word lines MWLx and MWLbx, the main word line MWLx becomes the "H" state and the main word line MWLbx becomes the "L" state. On the contrary, in the non-selected main word lines MWLx and MWLbx, the main word line MWLx becomes the "L" state and the main word line MWLbx becomes the "H" state. One pair of main word lines MWLx and MWLbx is connected to one row decoder 10. The row decoder 10 selectively drives one of eight word lines WL included in a group of word line WLx<7:0>. The group of word line WLx<7:0> is located under the hierarchy of the main word lines MWLx and MWLbx. The row decoder 10 connected to the main word lines MWLx and MWLbx selectively driven by the main row decoder 11 further selectively drives the word line WL, thereby selectively driving one word line WL.

Eight write drive lines WDRV<7:0> and row power supply line VRow are connected to the write drive line driver 12, and the row power supply line VRow is connected to the row power supply line driver 13. The write drive lines WDRV<7:0> and the row power supply line VRow are connected to the row decoder 10. The voltage is applied to the write drive line WDRV<7:0> and the row power supply line VRow in order that the row decoder 10 drives the word line WL. Specifically, during the reset operation, the voltage Vss (=0 V) is supplied to one write drive line WDRV corresponding to the selected word line WL in the eight write drive lines WDRV<7:0>, and the voltage Vreset is supplied to other write drive lines WDRV of the write drive lines WDRV<7:0>. The voltage (Vreset) supplied to the word line WL under the hierarchy of the non-selected main word line MWL and MWLbx is applied to the row power supply VRow.

The row-system peripheral circuit 14 manages the whole of the resistive memory device. The row-system peripheral circuit 14 receives a control signal from an external host apparatus, the row-system peripheral circuit 14 reads, write, and erases the data, and the row-system peripheral circuit 14 performs data input and output management.

The bit line BL of the embodiment also has the hierarchical structure, and the column decoder 21 selectively drives one of pairs of column selection lines CSLy and CSLby in 128 pairs of column selection lines CSLy and CSLby (y=<127:0>). For example, in the selected column selection lines CSLy and CSLby, the column selection line CSLy becomes the "H" state and the column selection line CSLby becomes the "L" state. On the contrary, in the non-selected column selection lines CSLy and CSLby, the column selection line CSLy becomes the "L" state and the column selection line CSLby becomes the "H" state. One pair of column selection lines CSLy and CSLby is connected to one column switch 20. The column switch 20 selectively drives one of bit line including a group of bit line BLy<3:0> comprising four bit lines BL located under the hierarchy of the column selection lines CSLy and CSLby. The column switch 20 that is connected to the column selection lines CSLy and CSLby selectively driven by the column decoder 21 further selectively drives the bit line BL, thereby selectively driving the bit line BL.

Four local data lines LDQ<3:0> are connected to the sense amplifier/write buffer 22. The local data lines LDQ<3:0> are connected to the column switch 20. The sense amplifier/write buffer 22 detects and amplifies signals read on the local data lines LDQ<3:0>, and the sense amplifier/write buffer 22 supplies the write data fed from data input and output lines IO<3:0> to the memory cell MC through the column switch 20. The voltage is applied to the local data line LDQ<3:0> in order that the column switch 20 drives the bit line BL. Specifically, voltage Vreset is supplied to four local data lines LDQ<3:0> in the reset operation.

The column power supply line driver 23 is connected to the sense amplifier/write buffer 22 through a column power supply line VCol1. The column-system peripheral circuit 24 manages the whole of the resistive memory device. The column-system peripheral circuit 24 receives a control signal from an external host apparatus, the column-system peripheral circuit 24 reads, write, and erases the data, and the column-system peripheral circuit 24 performs data input and output management.

The detailed configuration of the row control circuit will be described with reference to FIGS. 12 to 15. FIGS. 12 to 15 are circuit diagrams illustrating an example of the configuration of the row control circuit in the resistive memory device.

[Configuration of Row Decoder 10]

Figure 12:
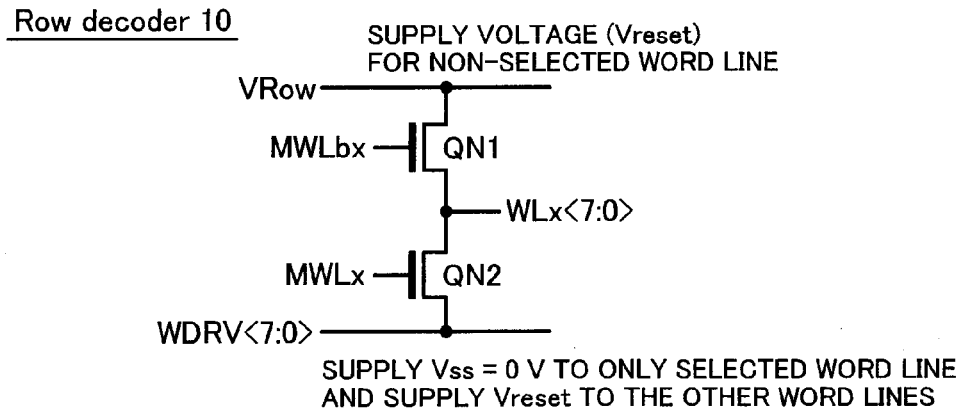
FIG. 12 is a circuit diagram illustrating an example configuration of a row control circuit in the resistive memory device according to the embodiment.

As illustrated in FIGS. 11 and 12, one of the 256 pairs of main word lines MWLx and MWLbx (x=<255:0>), the row power supply line VRow, and the write drive lines WDRV<7:0> are connected to the row decoder 10. The group of word line WLx<7:0> is connected to the row decoder 10, and the group of word line WLx<7:0> is connected to the plural memory cells MC that are arrayed in line. As described above, the group of word line WLx<7:0> connected to the one row decoder 10 includes the eight wirings of word line WLx0 to word line WLx7. Similarly the write drive lines WDRV<7:0> are the eight wirings WDRV0 to WDRV7.

As illustrated in FIG. 12, the row decoder 10 includes eight transistor pairs each of which sources of two NMOS transistors QN1 and QN2 are connected to each other. The main word line MWLbx is connected to a gate of the transistor QN1 and the row power supply line VRow is connected to a drain of the transistor QN1. The main word line MWLx is connected to the gate of the transistor QN2 and one of the write drive lines WDRV<7:0> is connected to the drain of the transistor QN2. The sources of the transistors QN1 and QN2 are connected to one of the word lines WL included in the group of word line WLx<7:0>.

[Configuration of Main Row Decoder 11]

Figure 13:
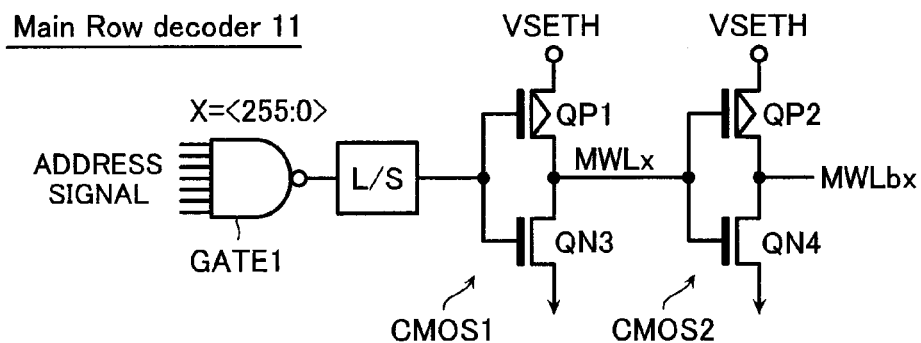
FIG. 13 is a circuit diagram illustrating an example configuration of a row control circuit in the resistive memory device according to the embodiment.

As illustrated in FIGS. 11 and 13, 256 pairs of main word lines MWLx and MWLbx (x=<255:0>) and an address signal line are connected to the main row decoder 11. The main row decoder 11 is a pre-decoder for driving the word line WL having the hierarchical structure. One set of main word lines MWLx and MWLbx is connected to eight transistor pairs (QN1 and QN2 of FIG. 12) in one row decoder 10, and one row decoder 10 can select one of the eight word lines WLx<7:0>. The main row decoder 11 includes a circuit of FIG. 13 in each set of main word lines MWLx and MWLbx.

As illustrated in FIG. 13, in one main row decoder 11, the address signal line connected to the main row decoder 11 is connected to a logic gate GATE1. An output signal of the logic gate GATE1 is supplied to an input terminal of a CMOS inverter CMOS1 through a level shifter L/S. The CMOS inverter CMOS1 includes a PMOS transistor QP1 and an NMOS transistor QN3. A power supply VSETH is connected to the source of the transistor QP1, and the source of the transistor QN3 is grounded. The drains of the transistors QP1 and QN3 are connected to the main word line MWLx.

The main word line MWLx is connected to a CMOS inverter CMOS2. The CMOS inverter CMOS2 includes a PMOS transistor QP2 and an NMOS transistor QN4. The power supply VSETH is also connected to the source of the transistor QP2 and the source of the transistor QN4 is grounded. The drains of the transistors QP2 and QN4 are connected to the main word line MWLbx.

[Configuration of Write Drive Line Driver 12]

Figure 14:
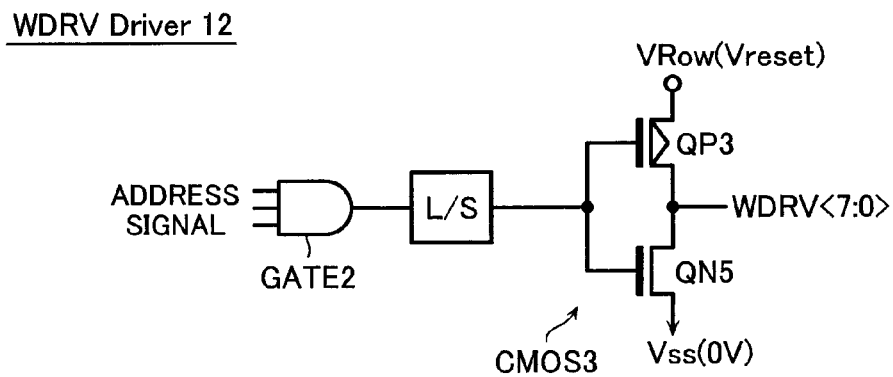
FIG. 14 is a circuit diagram illustrating an example configuration of a row control circuit in the resistive memory device according to the embodiment.

As illustrated in FIGS. 11 and 14, the row power supply line VRow and the address signal line are connected to the write drive line driver 12. At this point, the write drive line driver 12 is also a pre-decoder.

The address signal line connected to the write drive line driver 12 is connected to a logic gate GATE2. An output signal of the logic gate GATE2 is supplied to an input terminal of a CMOS inverter CMOS3 through a level shifter L/S. The CMOS inverter CMOS3 includes a PMOS transistor QP3 and an NMOS transistor QN5. The row power supply line VRow to which the voltage Vreset is applied as described later is connected to the source of the transistor QP3, and the source of the transistor QN5 is grounded. The drains of the transistors QP3 and QN5 are connected to the write drive lines WDRV<7:0>.

[Configuration of Row Power Supply Line Driver 13]

Figure 15:
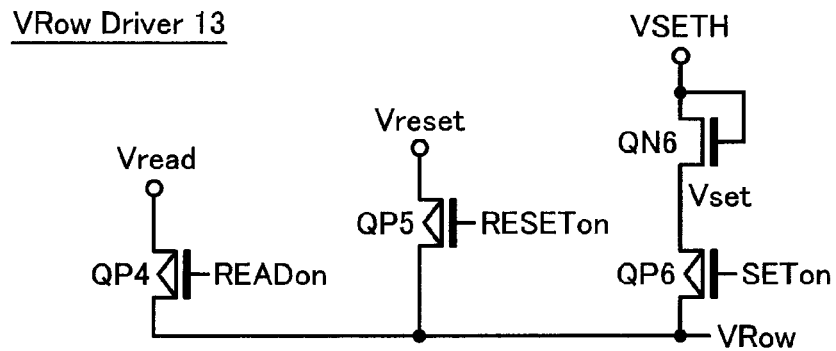
FIG. 15 is a circuit diagram illustrating an example configuration of a row control circuit in the resistive memory device according to the embodiment.

As illustrated in FIGS. 11 and 15, the row power supply line VRow and a control signal line are connected to the row power supply line driver 13. In the row power supply line driver 13, the power supply VSETH is connected to the drain and gate of the NMOS transistor QN6. The source of the transistor QN6 is connected to the row power supply line VRow through a PMOS transistor QP6. A control signal SETon is supplied to the gate of the transistor QP6.

In the row power supply line driver 13, the power supply VREAD is connected to the row power supply line VRow through a PMOS transistor QP4, and the power supply Vreset is connected to the row power supply line VRow through a PMOS transistor QP5. A control signal READon is supplied to the gate of the transistor QP4, and a control signal RESETon is supplied to the gate of the transistor QP5. The control signals READon and RESETon are changed from the "H" state to the "L" state in reading the data and in the reset operation, respectively.

A detailed configuration of the column control circuit will be described with reference to FIGS. 16 to 19. FIGS. 16 to 19 are circuit diagrams illustrating an example of the configuration of the column control circuit in the resistive memory device.

[Configuration of Column Switch 20]

Figure 16:
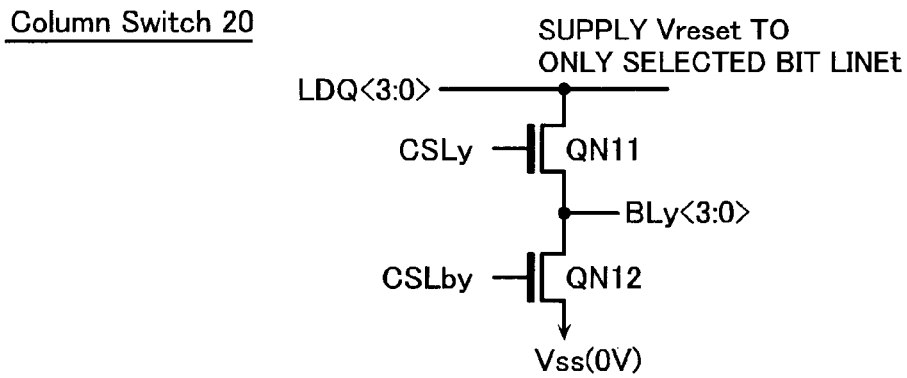
FIG. 16 is a circuit diagram illustrating an example configuration of a column control circuit in the resistive memory device according to the embodiment.

As illustrated in FIGS. 11 and 16, one of the 128 pairs of column selection lines CSLy and CSLby (y=<127:0>) and the local data lines LDQ<3:0> are connected to the column switch 20. The group of bit line BLy<3:0> is connected to the column switch 20, and the group of bit line Bly<3:0> is connected to the plural memory cells MC that are arranged in line. As described above, the group of bit line BLy<3:0> connected to one column switch 20 includes the four wirings of bit line BLy0 to bit line BLy3. Similarly, the local data lines LDQ<3:0> includes the four wirings LDQ0 to LDQ3.

As illustrated in FIG. 16, the column switch 20 includes four pairs of transistors each of which sources of two NMOS transistors QN11 and QN12 are connected to each other. The column selection line CSLy is connected to the gate of the transistor QN11, and one of the local data lines LDQ<3:0> is connected to the drain of the transistor QN11. The column selection line CSLby is connected to the gate of the transistor QN12, and the drain of the transistor QN12 is grounded. The sources of the transistors QN11 and QN12 are connected to one of the bit lines BL included in the group of bit line BLy<3:0>.

[Configuration of Column Decoder 21]

Figure 17:
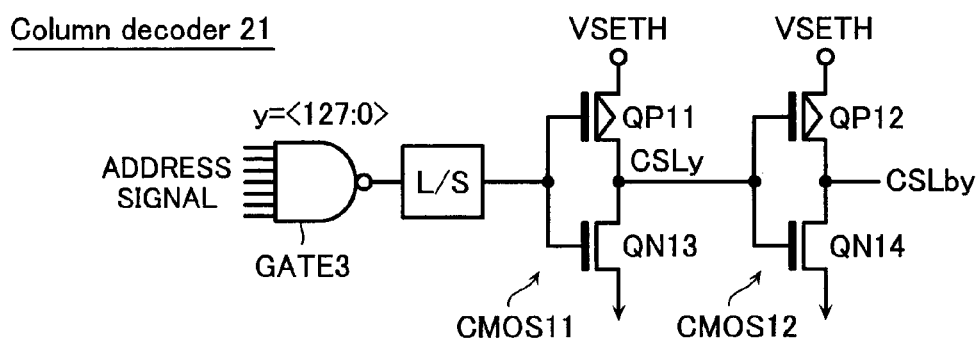
FIG. 17 is a circuit diagram illustrating an example configuration of a column control circuit in the resistive memory device according to the embodiment.

As illustrated in FIGS. 11 and 17, the 128 pairs of column selection lines CSLy and CSLby (y=<127:0>) and the address signal line are connected to the column decoder 21. In the resistive memory device of the embodiment, one set of column selection lines CSLy and CSLby is connected to four transistor pairs (QN11 and QN12 of FIG. 16) in one column switch 20, and one column switch 20 selectively drives one of bit lines in the groups of bit line Bly<3:0>. The column decoder 21 includes a circuit of FIG. 17 in each pair of column selection lines CSLy and CSLby.

As illustrated in FIG. 17, in one column decoder 21, the address signal line connected to the column decoder 21 is connected to a logic gate GATE3. An output signal of the logic gate GATE3 is supplied to an input terminal of a CMOS inverter CMOS11 through a level shifter L/S. The CMOS inverter CMOS11 includes a PMOS transistor QP11 and an NMOS transistor QN13. The power supply VSETH is connected to the source of the transistor QP11 and the source of the transistor QN13 is grounded. The drains of the transistors QP11 and QN13 are connected to the column selection line CSLy.

The column selection line CSLy is connected to a CMOS inverter CMOS12. The CMOS inverter CMOS12 includes a PMOS transistor QP12 and an NMOS transistor QN14. The power supply VSETH is also connected to the source of the transistor QP12, and the source of the transistor QN14 is grounded. The drains of the transistors QP12 and QN14 are connected to the column selection line CSLby.

[Configuration of Sense Amplifier/Write Buffer 22]

Figure 18:
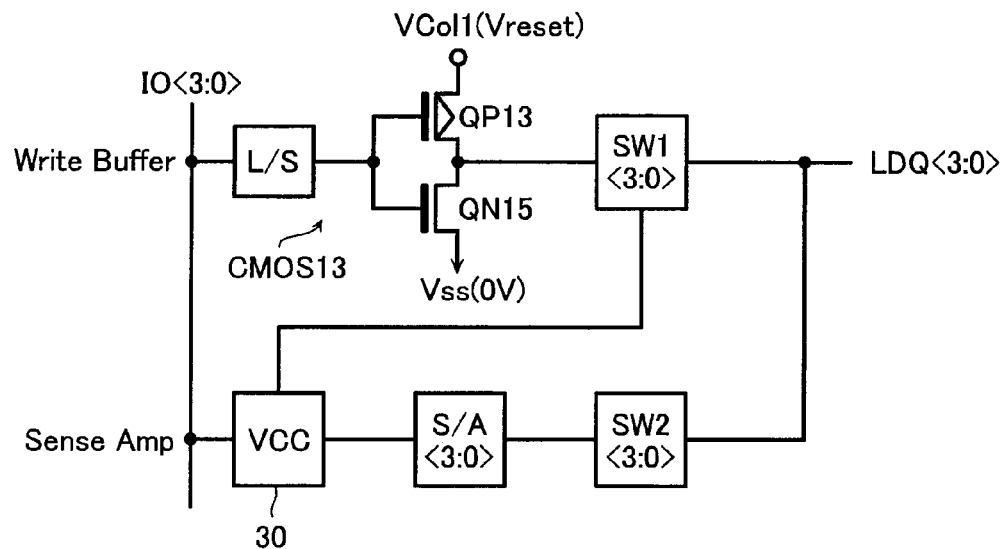
FIG. 18 is a circuit diagram illustrating an example configuration of a column control circuit in the resistive memory device according to the embodiment.

As illustrated in FIGS. 11 and 18, the column power supply line VCol1, the local data lines LDQ<3:0>, and the data input and output lines IO<3:0> are connected to the sense amplifier/write buffer 22. A configuration of the write buffer portion will be described below. The data input and output lines IO<3:0> connected to the sense amplifier/write buffer 22 are connected to a CMOS inverter CMOS13 through a level shifter L/S. The CMOS inverter CMOS13 includes a PMOS transistor QP13 and an NMOS transistor QN15. The column power supply line VCol1 is connected to the source of the transistor QP13. The reset voltage Vreset is applied to the column power supply line VCol1 as described later. The source of the transistor QN15 is grounded. The drains of the transistors QP13 and QN15 are connected to the local data lines LDQ<3:0> through a switch SW1.

Next, the structure of the sense amplifier will be described. The local data lines LDQ<3:0> are connected to a sense amplifier S/A through a switch SW2. Various types of sense amplifiers, such as a single-end sense amplifier and a differential sense amplifier using a reference cell, may be used as the sense amplifier S/A. Data (resistance state) read from the memory cell MC by the sense amplifier S/A is transmitted to the outside through a verify control circuit 30 and the data input/output lines IO<3:0>. The verify control circuit 30 is used during, for example, the reset operation, and receives the resistance state of the memory cell MC from the sense amplifier S/A in each of a plurality of reset pulse application operations. When the resistance state of the memory cell MC is changed to the high resistance state, the verify control circuit 30 turns off the switch SW1 to stop the application of the reset pulse to the memory cell MC. When the resistance state of the memory cell MC is maintained in the low resistance state, the verify control circuit 30 operates to apply the reset pulse continuously to the memory cell MC. When receiving information indicating that all of the memory cells MC subjected to the reset operation have been changed to the high resistance state from the sense amplifier S/A, the verify control circuit 30 transmits the information to an external control circuit through the data input/output line I/O. The reset operation of the resistive memory device is completed on the basis of the information.

[Configuration of Column Power Supply Line Driver 23]

Figure 19:
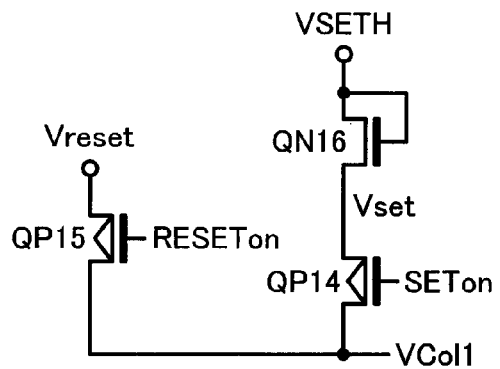
FIG. 19 is a circuit diagram illustrating an example configuration of a column control circuit in the resistive memory device according to the embodiment.

As illustrated in FIGS. 11 and 19, the column power supply line VCol1 and the control signal line are connected to the column power supply line driver 23. In the column power supply line driver 23, the power supply VSETH is connected to a drain and a gate of an NMOS transistor QN16, and a source of the transistor QN16 is connected to the column power supply line VCol1 through a PMOS transistor QP14. The control signal SETon is supplied to the gate of the transistor QP14.

In the column power supply line driver 23, the power supply Vreset is connected to the column power supply line VCol1 through a PMOS transistor QP15. The control signal RESETon is supplied to the gate of the transistor QP15. The control signal RESETon is changed from the "H" state to the "L" state in the reset operation.

Reset operations in the resistive memory device so configured will now be described below. Referring first to FIGS. 11 to 15, the operation of a row control circuit in the resistive memory device in reset operation will be described below. As illustrated in FIG. 11, the word lines WL have a hierarchical structure. The voltage, which is applied to write drive lines WDRV<7:0> or a row power supply line VRow, is applied to a group of word lines WLx<7:0> selectively driven by the main row decoder 11 and the row decoder 10. Firstly, the operation for applying voltage to the write drive lines WDRV<7:0> and the row power supply line VRow that are connected to the row decoder 10 will be described below.

[Operation of Row Power Supply Line Driver 13]

In reset operation, at a row power supply line driver 13, a control signal (RESETon signal) that has been supplied to the gate of a transistor QP5 becomes "L" state and the transistor QP5 is conductive. The row power supply line driver 13 drives the row power supply line VRow to a voltage Vreset in reset operation.

[Operation of Write Drive Line Driver 12]

A write drive line driver 12 has a logic gate GATE2 to which an address signal is input. Based on the address signal, the logic gate GATE2 supplies to the input terminal of a CMOS inverter CMOS3 an "H" signal for one of the write drive lines (e.g., WDRV1) that corresponds to the address signal, and an "L" signal for every other write drive line that does not correspond to the address signal. For a write drive line (e.g., WDRV1) that corresponds to the address signal, an "H" signal is supplied to the input terminal of the CMOS inverter CMOS3, and a ground voltage Vss (e.g., 0 V) is applied to the write drive line WDRV1 via the conductive transistor QN5. For every other write drive line that does not correspond to the address signal, an "L" signal is supplied to the input terminal of the CMOS inverter CMOS3, and the voltage of the row power supply line VRow (Vreset) is applied to the write drive lines WDRV via the conductive transistor QP3.

Secondly, how the main word lines MWLx, MWLbx and the word lines WLx<7:0> are selectively driven by the main row decoder 11 and the row decoder 10 will be described below.

[Operation of Main Row Decoder 11]

An address signal is also supplied to the input terminal of a logic gate GATE1 in the main row decoder 11. Based on the address signal, the logic gate GATE1 supplies to the input terminal of a CMOS inverter CMOS1 an "L" signal for the selected x (e.g., x=0) of x=<255:0>, and an "H" signal for every non-selected x. Firstly, description is made on the selected x (e.g., x=0). For the selected x (e.g., x=0), an "L" signal is supplied to the input terminal of the CMOS inverter CMOS1, and an "H" signal of the power supply VSETH is supplied to a main word line MWL0 via the conductive transistor QP1. In addition, the "H" signal of the main word line MWL0 is supplied to the input terminal of a CMOS inverter CMOS2, and the "L" signal at ground voltage Vss is supplied to a main word line MWLb0 via the conductive transistor QN4. That is, for the selected x (e.g., x=0), an "H" signal is supplied to the main word line MWL0, while an "L" signal is supplied to the main word line MWLb0.

Secondly, description is made on the non-selected x. For each non-selected x, an "H" signal is supplied to the input terminal of a CMOS inverter CMOS1, and an "L" signal at ground voltage Vss is supplied to a main word line MWLx via the conductive transistor QN3. In addition, the "L" signal of the main word line MWLx is supplied to the input terminal of a CMOS inverter CMOS2, and the "H" signal of the power supply VSETH is supplied to a main word line MWLbx via the conductive transistor QP2. That is, for each non-selected x, an "L" signal is supplied to a respective main word line MWLx, while an "H" signal is supplied to a respective main word line MWLbx.

[Operation of Row Decoder 10]

The row decoder 10 applies the voltage of the row power supply line VRow or the write drive lines WDRV to the corresponding word lines WL based on the signals supplied to the main word lines MWLx and MWLbx. For the selected x (e.g., x=0), an "H" signal is supplied to the main word line MWL0 and an "L" signal is supplied to the main word line MWLb0. Since an "L" signal is supplied to the gate of a transistor QN1 and an "H" signal is supplied to the gate of a transistor QN2 in the row decoder 10, the voltage of the write drive lines WDRV<7:0> is applied to the group of word lines WL0<7:0> via the conductive transistor QN2. In this case, a ground voltage (e.g., 0 V) is applied to a write drive line (e.g., WDRV1) that corresponds to the address signal, and the voltage of the row power supply line VRow (e.g., Vreset) is applied to the other write drive lines that do not correspond to the address signal. The ground voltage (e.g., 0 V) is only applied to one of the word lines WL01 among the group of word lines WL0<7:0> that corresponds to the address signal, while the voltage Vreset is applied to the other word lines WL.

In addition, for each non-selected x, an "L" signal is supplied to a main word line MWLx and an "H" signal is supplied to a main word line MWLbx. Since an "H" signal is supplied to the gate of the transistor QN1 and an "L" signal is supplied to the gate of the transistor QN2 in the row decoder 10, the voltage of the row power supply line VRow (Vreset) is applied to the group of word lines WLx<7:0> via the conductive transistor QN1. As a result, in reset operation, the ground voltage (0 V) is only applied to one of the word lines WL01 that is selected by the address signal, while the voltage of the row power supply line VRow (Vreset) is applied to every other word line WL.

Referring now to FIG. 11 and FIGS. 16 to 19, the operation of a column control circuit in the resistive memory device in reset operation will be described below. The voltage, which is applied to local data lines LDQ<3:0>, is applied to a group of bit lines BLy<3:0> selectively driven by a column decoder 21 and a column switch 20. In addition, the voltage of a column power supply line VCol1 is applied to the local data lines LDQ<3:0> via a sense amplifier/write buffer 22. Firstly, the operation for applying the voltage to the local data lines LDQ<3:0> and the column power supply line VCol1 will be described below.

[Operation of Column Power Supply Line Driver 23]

In reset operation, at a column power supply line driver 23, a control signal (RESETon signal) that has been supplied to the gate of a transistor QP15 becomes "L" state and the transistor QP15 is conductive. The column power supply line driver 23 drives the column power supply line VCol1 to a voltage Vreset in reset operation.

[Operation of Sense Amplifier/Write Buffer 22]

In reset operation, at a sense amplifier/write buffer 22, switches SW1 of the write buffer part turn on and become conductive, while switches SW2 of the sense amplifier part turn off and become non-conductive. Write data is supplied to the sense amplifier/write buffer 22 from data input/output lines IO<3:0>. The write data is supplied to the input terminal of a CMOS inverter CMOS13 via a level shifter L/S. For the local data lines LDQ<3:0>, an "L" signal is supplied to the input terminal of the CMOS inverter CMOS13, and the voltage of the column power supply line VCol1 (Vreset) is applied to the local data lines LDQ<3:0> via the conductive transistor QP13 and the switch SW1. For every other local data line that does not correspond to the write data, an "H" signal is supplied to the input terminal of the CMOS inverter CMOS13, and a ground voltage Vss (e.g., 0 V) is applied to the local data lines LDQ via the conductive transistor QN15 and the switch SW1.

Secondly, how column selection lines CSLy and CSLby and a group of bit lines BLy<3:0> are selectively driven by the column decoder 21 and the column switch 20 will be described below.

[Operation of Column Decoder 21]

An address signal is supplied to the input terminal of a logic gate GATE3 in the column decoder 21. Based on the address signal, the logic gate GATE3 supplies to the input terminal of a CMOS inverter CMOS11 an "L" signal for each y (e.g., y=0) selected from y=<127:0>, and an "H" signal for each non-selected y. Firstly, description is made on the selected y (e.g., y=0). For selected y (e.g., y=0), an "L" signal is supplied to the input terminal of the CMOS inverter CMOS11, and an "H" signal of the power supply VSETH is supplied to a column selection line CSL0 via the conductive transistor QP11. In addition, the "H" signal of the column selection line CSL0 is supplied to the input terminal of a CMOS inverter CMOS12, and the "L" signal at ground voltage Vss is supplied to a column selection line CSLb0 via the conductive transistor QN14. That is, for selected y (e.g., y=0), an "H" signal is supplied to the column selection line CSL0, while an "L" signal is supplied to the column selection line CSLb0.

Secondly, description is made on the non-selected y. For each non-selected y, an "H" signal is supplied to the input terminal of the CMOS inverter CMOS11, and an "L" signal at ground voltage Vss is supplied to the column selection line CSLy via the conductive transistor QN13. In addition, the "L" signal of the column selection line CSLy is supplied to the input terminal of the CMOS inverter CMOS12, and an "H" signal of the power supply VSETH is supplied to the column selection line CSLby via the conductive transistor QP12. That is, for each non-selected y, an "L" signal is supplied to the column selection line CSLy, while an "H" signal is supplied to the column selection line CSLby.

[Operation of Column Switch 20]

The column switch 20 applies the voltage of local data lines LDQ<3:0> to the bit lines BL based on the signals supplied to the column selection lines CSLy and CSLby. For the selected y (e.g., y=0), an "H" signal is supplied to the column selection line CSL0 and an "L" signal is supplied to the column selection line CSLb0. An "H" signal is supplied to the gate of a transistor QN11 and an "L" signal is supplied to the gate of a transistor QN12 in the column switch 20. Thus, the reset voltage Vreset of the local data lines LDQ<3:0> is applied to each of the selected groups of bit lines BL0<3:0> via the conductive transistor QN11. As a result, the reset voltage (e.g., Vreset) is applied to the group of bit lines BL0<3:0>.

On the other hand, for each non-selected y, an "L" signal is supplied to the column selection line CSLy and an "H" signal is supplied to the column selection line CSLby. An "L" signal is supplied to the gate of the transistor QN11 and an "H" signal is supplied to the gate of the transistor QN12 in the column switch 20. Thus, a ground voltage Vss=0 V is applied to the group of bit lines BLy<3:0> via the conductive transistor QN12. As a result, in reset operation, the voltage Vreset is applied to the bit lines BL0<3:0> which are selected by the write data, while the ground voltage (0 V) is applied to every other bit line BL.

In the above-mentioned column control circuit, during the reset operation, the voltage Vreset is applied to the selected bit lines BL00 to BL03 that are connected to the selected memory cells MC10 to MC13. However, for example, a clamp transistor may be provided on the current path of the column control circuit, and a voltage applied to the gate of the clamp transistor may be controlled to increase the value of the reset voltage generated during a plurality of reset pulse application operations by a certain voltage width Vα.

In the resistive memory device according to this embodiment, the voltage value of the increment Vα of the reset voltage is substantially equal to a value obtained by subtracting the maximum value Vreset_Bit(Max) of the distribution of the reset voltage of one memory cell from the minimum value Vset_Bit(Min) of the distribution of the set voltage of the memory cell. The memory cell MC whose state has not been changed by the reset pulse applied in a certain reset pulse application operation may be changed to the reset state by the reset pulse applied in the next reset pulse application operation. However, the voltage required for the reset operation of the memory cell does not exceed the set voltage. As a result, it is possible to prevent the memory cell MC from being erroneously set. Therefore, it is possible to prevent the memory cell from being erroneously set and achieve a stable reset operation by adjusting the increment Vα of the voltage applied and performing the reset pulse application operation and the reset verifying operation.

The exemplary embodiment of the invention has been described above, but the invention is not limited thereto. Various modifications, additions, and combinations of the components can be made without departing from the scope and spirit of the invention.

For example, as shown in FIGS. 9A to 9C, the margins of the reset voltage and the set voltage are affected by the parasitic resistance of the wiring extending from the control circuit to the memory cell MC. Therefore, the increment $V\alpha$ of the reset voltage may be changed on the basis of the position of the selected memory cell MC in the memory cell array. In this way, it is possible to control the reset voltage in consideration of a voltage drop caused by the wiring resistance. That is, when the influence of the parasitic resistance of the wiring is reduced, the margin between the reset voltage and the set voltage is increased, and the increment $V\alpha$ of the reset voltage is also increased. Therefore, it is possible to reduce the number of times the reset voltage is applied and perform the reset operation at a high speed. When the influence of the parasitic resistance of the wiring is increased, the margin between the reset voltage and the set voltage is reduced. In this case, the increment $V\alpha$ of the reset voltage is reduced, and it is possible to finely control the increment of the reset voltage.

In the above-described embodiment, during the reset operation, the reset voltage Vreset applied to the selected bit line BL is increased by a plurality of reset pulse application operations. However, a non-selected word line voltage applied to the non-selected word line WL may be increased, similar to the reset voltage. In this way, it is possible to prevent an unnecessary potential difference from being applied to the non-selected memory cell MC that is not operated.

The maximum value Vreset_Bit(Max) or the minimum value Vset_Bit(Min) of one memory cell MC and the maximum value Vreset_Chip(Max) or the minimum value Vset_Chip(Min) of the memory cell array may be measured in advance by, for example, a die sort test. These values may be stored in a data memory area of, for example, a ROMFUSE provided in a peripheral circuit of the column control circuit or an external memory area, and they may be read from the memory area during the reset operation.

In the above-described embodiment of the invention, the resistive memory device sequentially increases the reset voltage during the reset operation. However, the value of a reset current corresponding to the reset voltage may be sequentially increased.

What is claimed is:

1. A semiconductor storage device comprising:
   a memory cell array including a plurality of first wirings, a plurality of second wirings intersecting the first wirings, and memory cells positioned at intersecting portions between the first wirings and the second wirings, each of the memory cells having a variable resistance element; and
   a control circuit configured to apply a control voltage, which transitions the variable resistance element from a low resistance state to a high resistance state, to a selected memory cell through a selected first wiring and a selected second wiring,
   wherein, when applying the control voltage to the memory cell plural times, the control circuit is configured to be capable of changing a value of the control voltage applied in each of control voltage application operations,
   the control circuit is operable to perform a plurality of control voltage application operations by increasing the value of the control voltage by a first value in each of second and subsequent control voltage application operations, and
   the control voltage initially applied is substantially equal to a minimum value of distribution of the voltage values of all the memory cells in the memory cell array for transitioning the resistance state of the variable resistance element in the memory cell from the high resistance state to the low resistance state, and is measured in advance by a die sort test.

2. The semiconductor storage device according to claim 1, wherein the first value is a difference between a minimum value of the distribution of the voltage value of one memory cell in the memory cell array for transitioning the resistance state of the variable resistance element of the memory cell from the high resistance state to the low resistance state and a maximum value of the distribution of the voltage value of one memory cell for transitioning the resistance state of the variable resistance element of the memory cell from the low resistance state to the high resistance state, and
wherein the first value is calculated in the die sort test.

3. The semiconductor storage device according to claim 1, wherein the control circuit reads the state of the selected memory cell during each of the plurality of control voltage application operations, and
the control circuit controls the application of the control voltage to the first wirings and the second wirings based on the state of the selected memory cell.

4. The semiconductor storage device according to claim 1, wherein, when a transition of the resistance state of the memory cell from the low resistance state to the high resistance state is detected by a read operation, the control circuit stops application of the control voltage to the first wiring and the second wiring corresponding to the memory cell.

5. The semiconductor storage device according to claim 1, wherein, when the value of the control voltage reaches the maximum value of the distribution of the voltage values of all the memory cells in the memory cell array for transitioning the resistance state of the variable resistance element of the memory cell from the low resistance state to the high resistance state, the control circuit ends the application of the control voltage.

6. The semiconductor storage device according to claim 1, wherein the control voltage includes a first control voltage applied to the first wiring and a second control voltage applied to the second wiring and lower than the first control voltage, and
the control circuit applies the first control voltage to the plurality of first wirings at the same time.

7. The semiconductor storage device according to claim 1, wherein the first value is obtained by dividing the difference between the maximum value of the distribution of the voltage values of all the memory cells in the memory cell array for transitioning the resistance state of the variable resistance element of the memory cell from the low resistance state to the high resistance state and the minimum value of the distribution of the voltage values of all the memory cells for transitioning the resistance state of the variable resistance element of the memory cell from the high resistance state to the low resistance state measured in the die sort test by a predetermined number of times the control voltage is applied.

8. The semiconductor storage device according to claim 1, wherein values of the control voltage initially applied and the first value are stored in a memory area.

9. The semiconductor storage device according to claim 8, wherein, when performing the plurality of control voltage application operations, the control circuit reads the values of the control voltage initially applied and the first value from the memory area.

10. The semiconductor storage device according to claim 8, wherein the memory area is provided by a ROMFUSE.

* * * * *